(12) United States Patent
Lu

(10) Patent No.: US 10,629,558 B2
(45) Date of Patent: Apr. 21, 2020

(54) ELECTRONIC DEVICE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/974,423

(22) Filed: May 8, 2018

(65) Prior Publication Data
US 2019/0348385 A1 Nov. 14, 2019

(51) Int. Cl.
| H01L 23/00 | (2006.01) |
| H01L 23/31 | (2006.01) |
| H01L 23/48 | (2006.01) |
| H01L 21/768 | (2006.01) |

(52) U.S. Cl.
CPC ........ *H01L 24/17* (2013.01); *H01L 21/76877* (2013.01); *H01L 23/3128* (2013.01); *H01L 23/481* (2013.01); *H01L 24/09* (2013.01); *H01L 24/11* (2013.01); *H01L 24/43* (2013.01); *H01L 24/48* (2013.01)

(58) Field of Classification Search
CPC ..... H01L 25/17; H01L 24/11; H01L 23/3128; H01L 24/48; H01L 23/481; H01L 24/09; H01L 24/43; H01L 21/76877; H01L 24/17; H01L 23/00; H01L 23/48; H01L 21/768
USPC ........................................ 257/737, 738, 778
See application file for complete search history.

(56) References Cited

U.S. PATENT DOCUMENTS

| 2003/0183947 A1* | 10/2003 | Ohuchi | H01L 21/56 257/778 |
| 2008/0079150 A1* | 4/2008 | Simon | H01L 23/3114 257/737 |
| 2013/0161809 A1* | 6/2013 | Chew | H05K 1/0373 257/734 |
| 2018/0177059 A1* | 6/2018 | Hattori | H01G 4/33 |
| 2019/0148325 A1* | 5/2019 | Lu | H01L 24/13 |

* cited by examiner

*Primary Examiner* — Alexander O Williams
(74) *Attorney, Agent, or Firm* — Foley & Lardner LLP

(57) ABSTRACT

An electronic device includes a first dielectric layer, a second dielectric layer and at least one first stud bump. The second dielectric layer is disposed on the first dielectric layer. The first stud bump is disposed in the first dielectric layer and the second dielectric layer. The first stud bump includes a bump portion and a stud portion, and the stud portion is disposed on the bump portion.

18 Claims, 28 Drawing Sheets

ELECTRONIC DEVICE

BACKGROUND

1. Field of the Disclosure

The present disclosure relates to an electronic device and a manufacturing method, and to an electronic device including at least one stud bump and a method for manufacturing the electronic device.

2. Description of the Related Art

Along with the rapid development in electronics industry and the progress of semiconductor processing technologies, semiconductor chips are integrated with an increasing number of electronic components to achieve better electrical performance and more functions. Accordingly, the semiconductor chips are provided with more input/output (I/O) connections. To manufacture semiconductor packages including semiconductor chips with an increased number of I/O connections, sizes of the semiconductor chips and the semiconductor packages may correspondingly increase. Thus, a manufacturing cost may correspondingly increase. Thus, a manufacturing cost may correspondingly increase. Alternatively, to minimize sizes of semiconductor packages including semiconductor chips including an increased number of I/O connections, the semiconductor substrates used for carrying the semiconductor chips should correspondingly redesigned. For an electronic device, such as a semiconductor substrate, functionality improvement and size reduction can be achieved by changing the materials thereof, or by changing the structural design thereof. When the materials of the electronic device are changed, the settings or parameters of production equipment and the manufacturing methods may be modified accordingly, which can be complicated and expensive as compared to adjusting the structural design thereof. Thus, an efficient way for improving functionality and reducing size of the electronic device is achieved by a structural design.

SUMMARY

In some embodiments, an electronic device includes a first dielectric layer, a second dielectric layer and at least one first stud bump. The second dielectric layer is disposed on the first dielectric layer. The first stud bump is disposed in the first dielectric layer and the second dielectric layer. The first stud bump includes a bump portion and a stud portion, and the stud portion is disposed on the bump portion.

In some embodiments, a method for manufacturing an electronic device includes (a) providing a carrier; (b) forming at least one first stud bump on the carrier, wherein the first stud bump includes a bump portion and a stud portion, and the stud portion is disposed on the bump portion; (c) forming a first dielectric layer to cover at least a portion of the bump portion of the first stud bump; and (d) forming a second dielectric layer on the first dielectric layer to cover at least a portion of the stud portion of the first stud bump.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
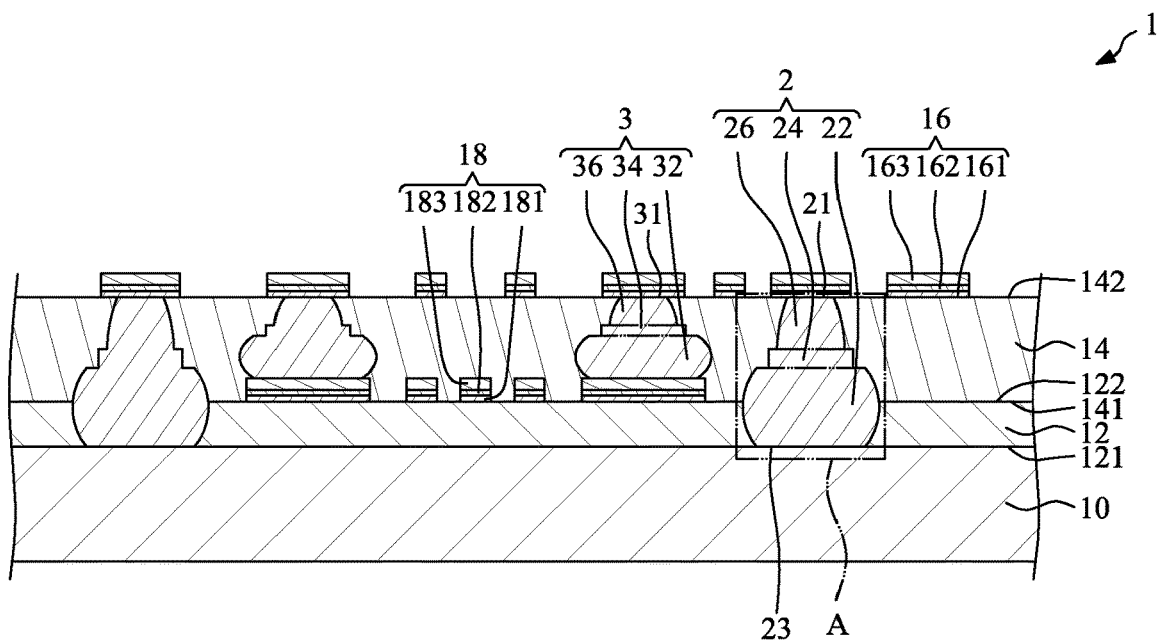
FIG. 1 illustrates a cross-sectional view of an electronic device 1 according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for an electronic device including at least one stud bump disposed in two dielectric layers. At least some embodiments of the present disclosure provide for techniques for manufacturing the electronic device.

In a comparative semiconductor substrate, a plurality of conductive vias are included for vertical electrical connection between different layers. Each of the conductive vias is in a solid cylinder shape or a solid cone shape. A method for manufacturing the conductive vias may include the following steps. Firstly, a first through hole is formed on a first dielectric layer by, for example, lithography or laser drilling. Then, a conductive material (e.g., copper) is formed in the first through hole by, for example, plating, to form a first conductive via. Then, a second dielectric layer is formed to cover the first dielectric layer and the first conductive via. Then, a second through hole is formed on the second dielectric layer by, for example, lithography or laser drilling. The position of the second through hole may correspond to the first conductive via. Thus, the first conductive via may be exposed from the second through hole. Then, a conductive material is formed in the second through hole by, for example, plating, to form a second conductive via disposed on and/or directly contacting the first conductive via. As stated in the aforementioned method, at least two hole-formation processes and at least two plating processes are needed. However, the more processes to be used, the greater the risk that some process may fail. That is, the more processes will increase the risk of failure of the semiconductor substrate. Additionally, the more processes will increase the manufacturing cost of the semiconductor substrate.

Further, if the material of the first dielectric layer includes glass fiber, the sidewall of the first through hole may be an irregularly uneven surface after the laser drilling process. That is, the tips of the broken fibers may protrude from the sidewall of the first through hole. Thus, during the plating process, the metal particles of the conductive material cannot be stacked and arranged tightly on the entire sidewall of the first through hole. As a result, after the plating process, the bonding strength between the first conductive via and the first dielectric layer is weak. When a warpage of the semiconductor substrate occurs due to coefficients of thermal expansion (CTEs) mismatch between the first conductive via and the first dielectric layer, the first conductive via may tend to delaminate from the first dielectric layer. In the same manner, the bonding strength between the second conductive via and the second dielectric layer is also weak, and the second conductive via may tend to delaminate from the second dielectric layer.

In addition, due to the composition of the electrolyte used in plating, the conductive material of the first conductive via tends to form a dimple shape or a protrusion shape. In other words, an upper surface of the first conductive via is not planar. Due to the dimple shape or protrusion shape of the first conductive via, a circuit structure, such as a conductive trace or the second conductive via, may not be disposed properly on or above the first conductive via. Moreover, if the second conductive via is disposed on the first conductive via, the bonding strength between the second conductive via and the first conductive via is weak due to the boundary between the second conductive via and the first conductive via. When a normal force is applied to the assembly structure of the second conductive via and the first conductive via, the assembly structure may readily crack at the boundary between the second conductive via and the first conductive via, resulting in an open circuit between the second conductive via and the first conductive via. That is, the ability of the assembly structure of the second conductive via and the first conductive via to resist the normal force and the shear force is low. In addition, the aspect ratio (A/R) (a ratio of height to width) of the first conductive via and the second conductive via is low, e.g., less than 10:1 due to the aforementioned dimple issue during the plating process.

The present disclosure provides for an electronic device including at least one stud bump to address at least the above concerns. In some embodiments, the stud bump is disposed in two dielectric layers for vertical electrical connection. The stud bump may be formed by wire bonding process rather than the lithography or laser drilling and plating processes. The stud bump can provide improved tolerance of normal force and shear force.

Figure 2:
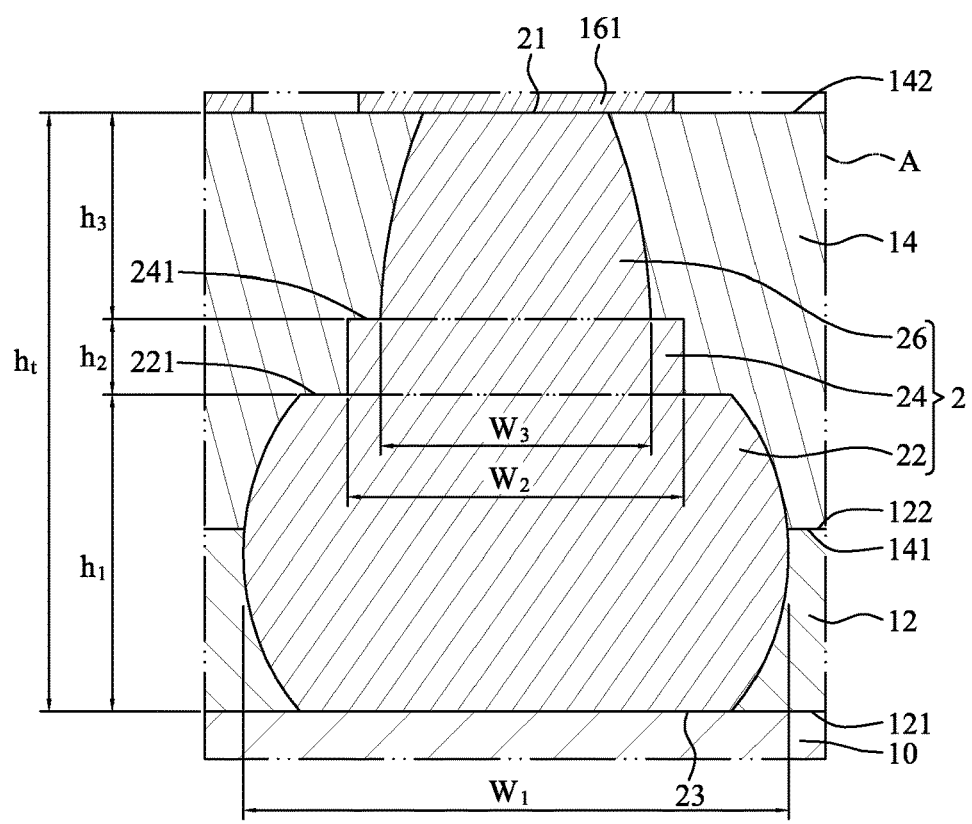
FIG. 2 illustrates an enlarged view of an area "A" shown in FIG. 1.

FIG. 1 illustrates a cross-sectional view of an electronic device 1 according to some embodiments of the present disclosure. FIG. 2 illustrates an enlarged view of an area "A" shown in FIG. 1. The electronic device 1 may be a wiring structure or a semiconductor substrate used for carrying a semiconductor chip or a semiconductor die. The electronic device 1 includes a carrier 10, at least one first stud bump 2, a first dielectric layer 12, a second dielectric layer 14, an upper circuit layer 16 (also referred to as "a first circuit layer"), a lower circuit layer 18 (also referred to as "a second circuit layer") and at least one second stud bump 3.

The carrier 10 may be, for example, a metal material, a ceramic material, a glass material, a substrate or a semiconductor wafer. The shape of the carrier 10 may be, for example, rectangular or square. Alternatively, the shape of the carrier 10 may be, for example, circular or elliptical. In the embodiment illustrated in FIG. 1, the carrier 10 is a metal material. A thickness of the carrier 10 may be in a range of about 100 μm to about 500 μm, about 200 μm to about 800 μm, or about 500 μm to about 1500 μm.

The first stud bump 2 may be formed or disposed on the carrier 10. In the embodiment illustrated in FIG. 1, the first stud bump 2 contacts the carrier 10 directly. A material of the first stud bump 2 (that is, a material included in the first stud bump 2) may be a conductive metal, such as, for example, copper and/or gold, or another metal or combination of metals, and may be formed or disposed by a wire-bonding process. The first stud bump 2 has a top surface 21 and a bottom surface 23.

As shown in FIG. 1, the first stud bump 2 may include a bump portion 22, a shoulder portion 24 and a stud portion 26. The bump portion 22 is formed or disposed on the carrier 10, and the stud portion 26 is disposed on or above the bump portion 22. The shoulder portion 24 is interposed between the stud portion 26 and the bump portion 22. In some embodiments, the bump portion 22, the shoulder portion 24 and the stud portion 26 are formed integrally and concurrently, thus, the first stud bump 2 is a monolithic structure without a boundary between the bump portion 22 and the shoulder portion 24 and a boundary between the shoulder portion 24 and the stud portion 26. A volume of the bump portion 22 of the first stud bump 2 may be greater than a volume of the stud portion 26 of the first stud bump 2 (e.g., may be about 1.1 or more times greater, about 1.2 or more times greater, about 1.3 or more times greater, or about 1.4 or more times greater), and a volume of the stud portion 26 of the first stud bump 2 may be greater than a volume of the shoulder portion 24 of the first stud bump 2 (e.g., may be about 1.1 or more times greater, about 1.2 or more times greater, about 1.3 or more times greater, or about 1.4 or more times greater).

As shown in FIG. 2, a maximum width $W_1$ of the bump portion 22 of the first stud bump 2 may be greater than a maximum width $W_2$ of the shoulder portion 24 of the first stud bump 2 (e.g., may be about 1.1 or more times greater, about 1.2 or more times greater, about 1.3 or more times greater, or about 1.4 or more times greater), and the maximum width $W_2$ of the shoulder portion 24 of the first stud bump 2 may be greater than a maximum width $W_3$ of the stud portion 26 of the first stud bump 2 (e.g., may be about 1.1 or more times greater, about 1.2 or more times greater, about 1.3 or more times greater, or about 1.4 or more times greater). A height $h_1$ of the bump portion 22 of the first stud bump 2 may be greater than or equal to the height $h_3$ of the stud portion 26 of the first stud bump 2, and the height $h_1$ of the bump portion 22 of the first stud bump 2 may be greater than a height $h_2$ of the shoulder portion 24 of the first stud bump 2 (e.g., may be about 1.3 or more times greater, about 1.5 or more times greater, about 2.0 or more times greater).

In some embodiments, the maximum width $W_3$ of the stud portion 26 of the first stud bump 2 may be substantially equal to the diameter D of the bonding wire 54 (FIG. 31) used in the wire-bonding process. The height $h_1$ of the bump portion 22 of the first stud bump 2 may be equal to about 1.2 times to 3 times the diameter D of the bonding wire 54 (FIG. 31), and the total height $h_t$ of the first stud bump 2 may be equal to about 2 times to 3 times the diameter D of the bonding wire 54. For example, the diameter D of the bonding wire 54 may be in a range of about 0.8 mils (thousandths of an inch) to about 2 mil, i.e., about 20 µm to about 50.8 µm, and the total height $h_t$ of the first stud bump 2 may be in a range of about 25 µm to about 120 µm.

In some embodiments, the bump portion 22 of the first stud bump 2 is substantially in a disk or puck shape (e.g. a puck that has a convex sidewall that bulges outwards), the shoulder portion 24 of the first stud bump 2 is substantially in a disk or puck shape, and the stud portion 26 of the first stud bump 2 is substantially in a cone shape (e.g. a cone having a convex side wall that bulges outwards). The bump portion 22 of the first stud bump 2 has a top surface 221, and the shoulder portion 24 of the first stud bump 2 is disposed on the top surface 221 of the bump portion 22. Thus, the sidewall of the bump portion 22 does not connect to the sidewall of the shoulder portion 24. In addition, the shoulder portion 24 of the first stud bump 2 has a top surface 241, and the stud portion 26 of the first stud bump 2 is disposed on the top surface 241 of the shoulder portion 24. Thus, the sidewall of the shoulder portion 24 does not connect to the sidewall of the stud portion 26.

As shown in FIG. 1, the first dielectric layer 12 may be a passivation layer and may include, or be formed from, a photoresist layer, a cured photosensitive material, a cured photoimageable dielectric (PID) material such as a polyamide (PA), a polyimide (PI), epoxy or polybenzoxazole (PBO), or a combination of two or more thereof. In one or more embodiments, the first dielectric layer 12 may include, or be formed from a dry film type material that includes a resin and a plurality of fillers. In one or more embodiments in which the dry film type material is a photosensitive material, such dry film type material may further include any of a sensitizer, a photoinitiator and a cross-linker. In one or more embodiments in which the dry film type material is a non-photosensitive material, such dry film type material omits the sensitizer, the photoinitiator and the cross-linker. In another embodiment, the first dielectric layer 12 may include, or be formed from a liquid type material that includes a homogeneous resin without fillers. In one or more embodiments in which the liquid type material is a photosensitive material, such liquid type material may further include diazonaphthoquinone (DNQ). In one or more embodiments in which the liquid type material is a non-photosensitive material, such liquid type material may omit diazonaphthoquinone (DNQ). In some embodiments, the first dielectric layer 12 may be a dry film material. In some embodiments, the material of the first dielectric layer 12 may include inorganic material (e.g., $SiO_x$, $SiN_x$, $TaO_x$), a glass, silicon, or a ceramic. A thickness of the first dielectric layer 12 may be in a range of about 5 µm to about 10 µm.

The first dielectric layer 12 covers the carrier 10 and at least a portion of the first stud bump 2. The first dielectric layer 12 has a first surface 121 and a second surface 122 opposite to the first surface 121. The first surface 121 of the first dielectric layer 12 contacts the carrier 10, and the second surface 122 of the first dielectric layer 12 is lower than the top surface 221 of the bump portion 22. Thus, the first dielectric layer 12 covers a lower portion of the bump portion 22 of the first stud bump 2, and the lower portion of the bump portion 22 of the first stud bump 2 is embedded in the first dielectric layer 12. An upper portion of the bump portion 22 of the first stud bump 2 is disposed at a higher elevation than the second surface 122 of the first dielectric layer 12. In the embodiment illustrated in FIG. 1, the first dielectric layer 12 may be formed or disposed after the formation of the first stud bump 2, thus, a surface condition (e.g., surface roughness) of a boundary between the first dielectric layer 12 and the bump portion 22 of the first stud bump 2 is determined by the surface condition (e.g., surface roughness) of the sidewall of the bump portion 22 of the first stud bump 2. As a result, the surface condition (e.g., surface roughness) of the boundary between the first dielectric layer 12 and the bump portion 22 of the first stud bump 2 may be smoother than the surface condition (e.g., surface roughness) of the sidewall of the through hole of the dielectric layer of the comparative semiconductor substrate.

The lower circuit layer 18 (i.e., the second circuit layer) may be a redistribution layer (RDL), and is disposed on the second surface 122 of the first dielectric layer 12. For example, the lower circuit layer 18 may include a first metal layer 181, a second metal layer 182 and a third metal layer 183 disposed in that order on the first dielectric layer 12. The first metal layer 181 and the second metal layer 182 may be seed layers including, for example, titanium and/or copper, another metal, or an alloy, and may be formed or disposed by sputtering. For example, the first metal layer 181 may include titanium, and the second metal layer 182 may include copper. The third metal layer 183 may include, for example, copper, or another metal or combination of metals, and may be formed or disposed by electroplating. In some embodiments, as shown in FIG. 1, the lower circuit layer 18 may include a plurality of conductive traces and/or a plurality of bonding pads. The lower circuit layer 18 may not contact the bump portion 22 of the first stud bump 2. However, in some embodiments, the lower circuit layer 18 may contact the bump portion 22 of the first stud bump 2. In one or more embodiments, a line width/line space (L/S) of the lower circuit layer 18 may be equal to or less than about 3 micrometers (µm)/about 3 µm, equal to or less than about 2 µm/about 2 µm (such as, for example, about 1.8 µm/about 1.8 µm or less, about 1.6 µm/about 1.6 µm or less, or about 1.4 µm/about 1.4 µm or less), equal to or less than about 1 µm/about 1 µm, or equal to or less than about 0.5 µm/about 0.5 µm.

The second stud bump 3 may be formed or disposed on the bonding pad of the lower circuit layer 18. In the embodiment illustrated in FIG. 1, the shape of the second stud bump 3 is similar to the shape of the first stud bump 2, and a height of the second stud bump 3 is smaller than a height of the first stud bump 2. That is, the second stud bump 3 can be treated as a compressed first stud bump 2. A material of the second stud bump 3 (that is, a material included in the second stud bump 3) may be a conductive metal, such as, for example, copper and/or gold, or another metal or combination of metals, and may be formed or disposed by a wire-bonding process.

As shown in FIG. 1, the second stud bump 3 may include a bump portion 32, a shoulder portion 34 and a stud portion 36. The bump portion 32 is formed or disposed on the bonding pad of the lower circuit layer 18, and the stud portion 36 is disposed on or above the bump portion 32. The shoulder portion 34 is interposed between the stud portion 36 and the bump portion 32. In some embodiments, the bump portion 32, the shoulder portion 34 and the stud portion 36 are formed integrally and concurrently, thus, the second stud bump 3 is a monolithic structure without a boundary between the bump portion 32 and the shoulder portion 34 and a boundary between the shoulder portion 34 and the stud portion 36. A volume of the bump portion 32 of the second stud bump 3 may be greater than a volume of the stud portion 36 of the second stud bump 3 (e.g., may be about 1.1 or more times greater, about 1.2 or more times greater, about 1.3 or more times greater, or about 1.4 or more times greater), and a volume of the stud portion 36 of the second stud bump 3 may be greater than a volume of the shoulder portion 34 of the second stud bump 3 (e.g., may be about 1.1 or more times greater, about 1.2 or more times greater, about 1.3 or more times greater, or about 1.4 or more times greater).

A maximum width of the bump portion 32 of the second stud bump 3 may be greater than a maximum width of the shoulder portion 34 of the second stud bump 3 (e.g., may be about 1.1 or more times greater, about 1.2 or more times greater, about 1.3 or more times greater, or about 1.4 or more times greater), and the maximum width of the shoulder portion 34 of the second stud bump 3 may be greater than a maximum width of the stud portion 36 of second stud bump 3 (e.g., may be about 1.1 or more times greater, about 1.2 or more times greater, about 1.3 or more times greater, or about 1.4 or more times greater). A height of the bump portion 32 of the second stud bump 3 may be greater than or equal to the height of the stud portion 36 of the second stud bump 3, and height of the bump portion 32 of the second stud bump 3 may be greater than a height of the shoulder portion 34 of the second stud bump 3 (e.g., may be about 1.3 or more times greater, about 1.5 or more times greater, about 2.0 or more times greater).

Figure 41:
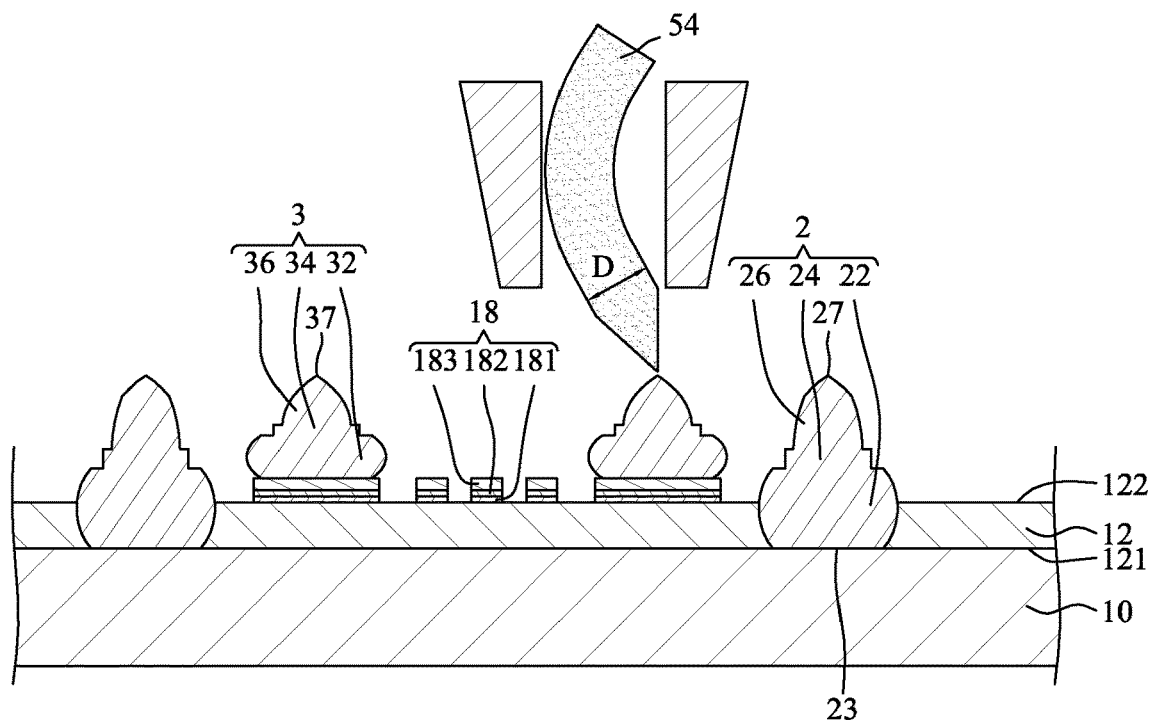
FIG. 41 illustrates one or more stages of an example of a method for manufacturing an electronic device according to some embodiments of the present disclosure.

In some embodiments, the maximum width of the stud portion 36 of the second stud bump 3 may be substantially equal to the diameter D of the bonding wire 54 (FIG. 41) used in the wire-bonding process. The height of the bump portion 32 of the second stud bump 3 may be equal to about 1.2 times to 3 times the diameter D of the bonding wire 54 (FIG. 41), and the total height of the second stud bump 3 may be equal to about 2 times to 3 times the diameter D of the bonding wire 54 (FIG. 41). For example, the diameter D of the bonding wire 54 (FIG. 41) may be in a range of about 0.8 mils (thousandths of an inch) to about 2 mil, i.e., about 20 μm to about 50.8 μm, and the total height of the second stud bump 3 may be in a range of about 25 μm to about 120 μm.

In some embodiments, the bump portion 32 of the second stud bump 3 is substantially in a disk or puck shape (e.g. a puck that has a convex sidewall that bulges outwards), the shoulder portion 34 of the second stud bump 3 is substantially in a disk or puck shape, and the stud portion 36 of the second stud bump 3 is substantially in a cone shape (e.g. a cone having a convex side wall that bulges outwards).

The second dielectric layer 14 may be a passivation layer and may include, or be formed from, a photoresist layer, a cured photosensitive material, a cured photoimageable dielectric (PID) material such as a polyamide (PA), a polyimide (PI), epoxy or polybenzoxazole (PBO), or a combination of two or more thereof. In one or more embodiments, the second dielectric layer 14 may include, or be formed from a dry film type material that includes a resin and a plurality of fillers. In one or more embodiments in which the dry film type material is a photosensitive material, such dry film type material may further include any of a sensitizer, a photoinitiator and a cross-linker. In one or more embodiments in which the dry film type material is a non-photosensitive material, such dry film type material omits the sensitizer, the photoinitiator and the cross-linker. In another embodiment, the second dielectric layer 14 may include, or be formed from a liquid type material that includes a homogeneous resin without fillers. In one or more embodiments in which the liquid type material is a photosensitive material, such liquid type material may further include diazonaphthoquinone (DNQ). In one or more embodiments in which the liquid type material is a non-photosensitive material, such liquid type material may omit diazonaphthoquinone (DNQ). In some embodiments, the second dielectric layer 14 may be a dry film material. In some embodiments, the material of the second dielectric layer 14 may include inorganic material (e.g., $SiO_x$, $SiN_x$, $TaO_x$), a glass, silicon, or a ceramic. The material of the second dielectric layer 14 may be the same as or different from the material of the first dielectric layer 12. A thickness of the second dielectric layer 14 may be in a range of about 10 μm to about 20 μm. The thickness of the second dielectric layer 14 may be greater than the thickness of the first dielectric layer 12.

The second dielectric layer 14 covers the first dielectric layer 12, the lower circuit layer 18, at least a portion of the first stud bump 2 and the second stud bump 3. The second dielectric layer 14 has a first surface 141 and a second surface 142 opposite to the first surface 141. The first surface 141 of the second dielectric layer 14 contacts the second surface 122 of the first dielectric layer 12, thus, the first surface 141 of the second dielectric layer 14 or the second surface 122 of the first dielectric layer 12 is the boundary between the second dielectric layer 14 and the first dielectric layer 12. As shown in FIG. 1, the boundary (e.g., the first surface 141 of the second dielectric layer 14 or the second surface 122 of the first dielectric layer 12) between the second dielectric layer 14 and the first dielectric layer 12 is lower than the top surface 221 of the bump portion 22 of the first stud bump 2. Thus, the second dielectric layer 14 covers the stud portion 26 and the shoulder portion 24 of the first stud bump 2 and the upper portion of the bump portion 22 of the first stud bump 2.

The second surface 142 of the second dielectric layer 14 is substantially coplanar with a top surface 21 of the first stud bump 2 and a top surface 31 of the second stud bump 3. In some embodiments, the top surface 21 of the first stud bump 2 and the top surface 31 of the second stud bump 3 may be exposed from the second surface 142 of the second dielectric layer 14. A total height $h_t$ of the first stud bump 2 is substantially equal to a sum of a thickness of the first dielectric layer 12 and a thickness of the second dielectric layer 14. Further, a thickness of the second dielectric layer 14 is substantially equal to a sum of a height of the second stud bump 3 and a thickness of the lower circuit layer 18.

The upper circuit layer 16 (i.e., the first circuit layer) may be a redistribution layer (RDL), and is disposed on the second surface 142 of the second dielectric layer 14. For example, the upper circuit layer 16 may include a first metal layer 161, a second metal layer 162 and a third metal layer 163 disposed in that order on the second dielectric layer 14. The first metal layer 161 and the second metal layer 162 may be seed layers including, for example, titanium and/or copper, another metal, or an alloy, and may be formed or disposed by sputtering. For example, the first metal layer 161 may include titanium, and the second metal layer 162 may include copper. The third metal layer 163 may include, for example, copper, or another metal or combination of metals, and may be formed or disposed by electroplating. In some embodiments, as shown in FIG. 1, the upper circuit layer 16 may include a plurality of conductive traces and/or a plurality of bonding pads. Portions of the upper circuit layer 16 may cover and contact the top surface 21 of the first stud bump 2 and the top surface 31 of the second stud bump 3. Thus, a portion of the upper circuit layer 16 may cover and contact the stud portion 36 of the second stud bump 3, and two ends of the second stud bump 3 may contact the lower circuit layer 18 and the upper circuit layer 16 respectively. The upper circuit layer 16 may be electrically connected to the lower circuit layer 18 through the second stud bump 3. In addition, another portion of the upper circuit layer 16 may cover and contact the stud portion 26 of the first stud bump 2.

In one or more embodiments, a line width/line space (L/S) of the upper circuit layer 16 may be equal to or less than about 3 µm/about 3 µm, equal to or less than about 2 µm/about 2 µm (such as, for example, about 1.8 µm/about 1.8 µm or less, about 1.6 µm/about 1.6 µm or less, or about 1.4 µm/about 1.4 µm or less), equal to or less than about 1 µm/about 1 µm, or equal to or less than about 0.5 µm/about 0.5 µm. In one or more embodiments, the line width/line space (L/S) of the lower circuit layer 18 is greater than the line width/line space (L/S) of the upper circuit layer 16.

In the electronic device 1 of FIG. 1, the first stud bump 2 and the second stud bump 3 are used for vertical electrical connection. The first stud bump 2 and the second stud bump 3 may be formed by wire bonding process rather than the lithography or laser drilling and plating processes. Thus, the fewer processes of the electronic device 1 will reduce the risk of failure of the electronic device 1. Additionally, the fewer processes will reduce the manufacturing cost of the electronic device 1. Further, since the first dielectric layer 12 may be formed or disposed after the formation of the first stud bump 2, the bonding strength between the first stud bump 2 and first dielectric layer 12 is relatively high. When a warpage of the electronic device 1 occurs, the first stud bump 2 may not tend to delaminate from the first dielectric layer 12. In the same manner, the bonding strength between the second stud bump 3 and second dielectric layer 14 is also relatively high, and the second stud bump 3 may not tend to delaminate from the second dielectric layer 14.

In addition, since the first stud bump 2 and the second stud bump 3 are formed by wire bonding rather than plating, the top ends of the first stud bump 2 and the second stud bump 3 will not form any dimple shape or a protrusion shape. In other words, the second surface 142 of the second dielectric layer 14 may be substantially coplanar with the top surface 21 of the first stud bump 2 and the top surface 31 of the second stud bump 3. Thus, the upper circuit layer 16 can be disposed properly on or above the first stud bump 2 and the second stud bump 3. Moreover, since the first stud bump 2 is formed integrally (i.e., is a monolithic structure), when a normal force is applied to the first stud bump 2, the first stud bump 2 may not readily crack. That is, the ability of the first stud bump 2 to resist the normal force and the shear force is relatively high. In addition, the aspect ratio (A/R) (a ratio of height to width) of the first stud bump 2 and the second stud bump 3 can be relatively high, e.g., greater than 10:1 or more, greater than 20:1 or more, or greater than 50:1 or more.

Figure 3:
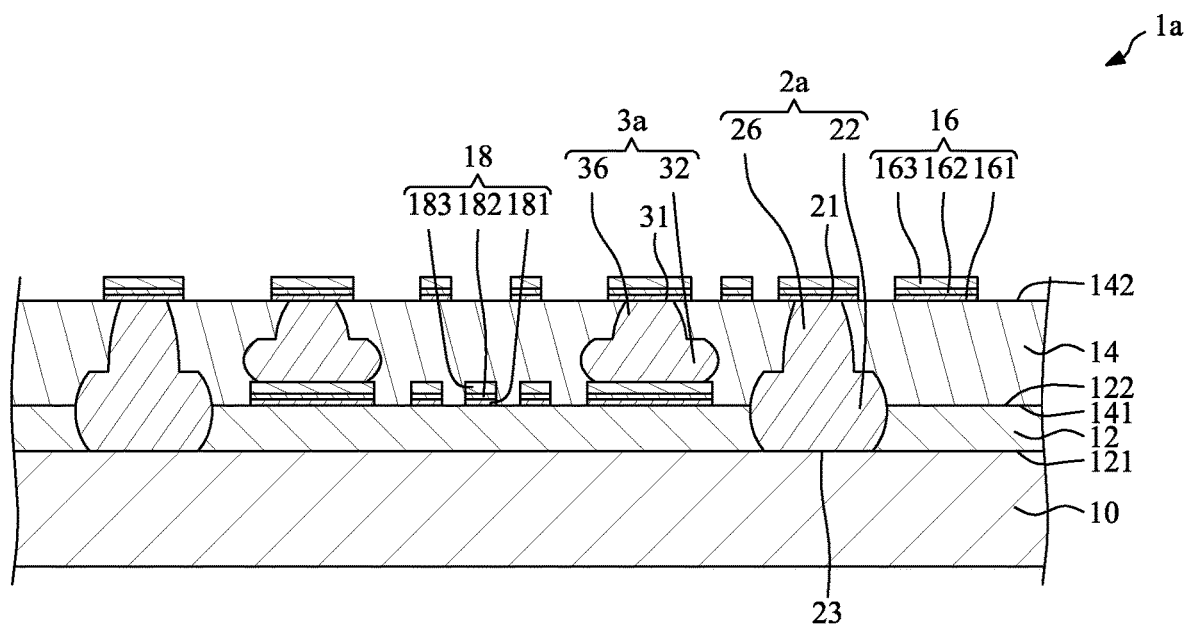
FIG. 3 illustrates a cross-sectional view of an electronic device according to some embodiments of the present disclosure.

FIG. 3 illustrates a cross-sectional view of an electronic device 1a according to some embodiments of the present disclosure. The electronic device 1a is similar to the electronic device 1 shown in FIG. 1 and FIG. 2, except for the structures of the first stud bump 2a and the second stud bump 3a. The first stud bump 2a of the electronic device 1a omits the shoulder portion 24 of the first stud bump 2 of FIG. 1 and FIG. 2. Thus, the first stud bump 2a only or at least primarily includes the bump portion 22 and the stud portion 26. The stud portion 26 of the first stud bump 2a is disposed on the top surface 221 of the bump portion 22. The maximum width $W_1$ of the bump portion 22 of the first stud bump 2 is greater than the maximum width $W_3$ of the stud portion 26 of the first stud bump 2. In addition, the second stud bump 3a of the electronic device 1a omits the shoulder portion 34 of the second stud bump 3 of FIG. 1. Thus, the second stud bump 3a only or at least primarily includes the bump portion 32 and the stud portion 36. The stud portion 36 of the second stud bump 3a is disposed on the bump portion 32.

Figure 4:
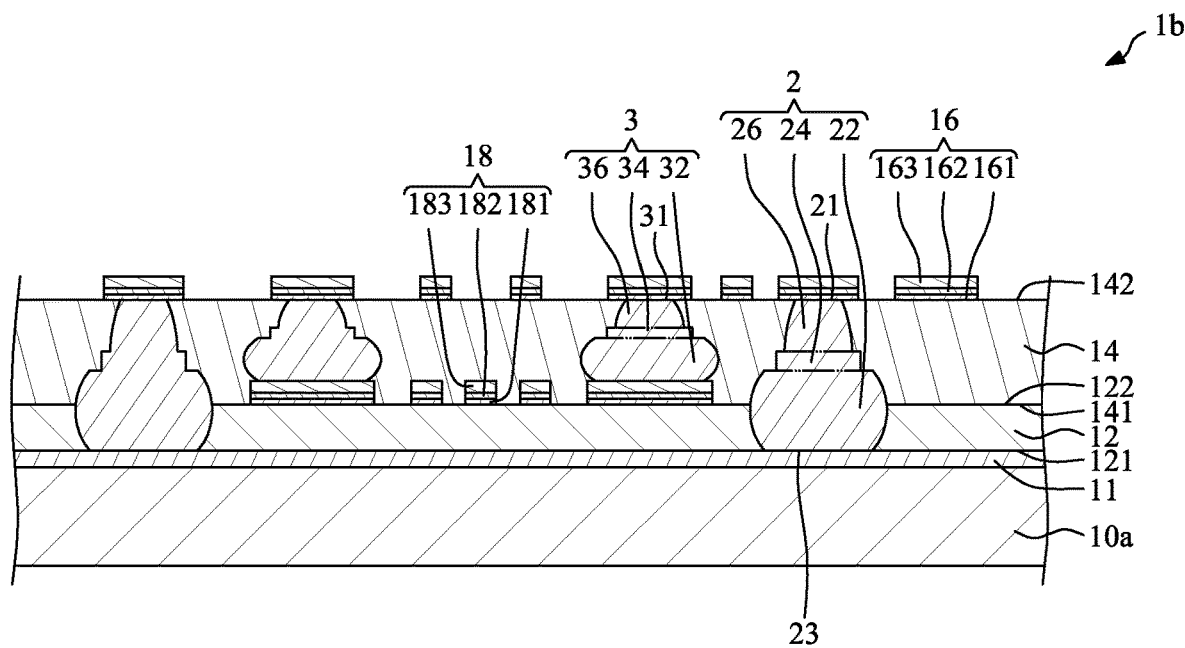
FIG. 4 illustrates a cross-sectional view of an electronic device according to some embodiments of the present disclosure.

FIG. 4 illustrates a cross-sectional view of an electronic device 1b according to some embodiments of the present disclosure. The electronic device 1b is similar to the electronic device 1 shown in FIG. 1 and FIG. 2, except that a metal layer 11 is further included between the first dielectric layer 12 and the carrier 10a. The metal layer 11 may include, for example, copper, or another metal or combination of metals. The carrier 10a may be non-metal material, for example, a ceramic material, a glass material, a substrate or a semiconductor wafer. The first stud bump 2 and the second stud bump 3 are formed or disposed on the metal layer 11.

Figure 5:
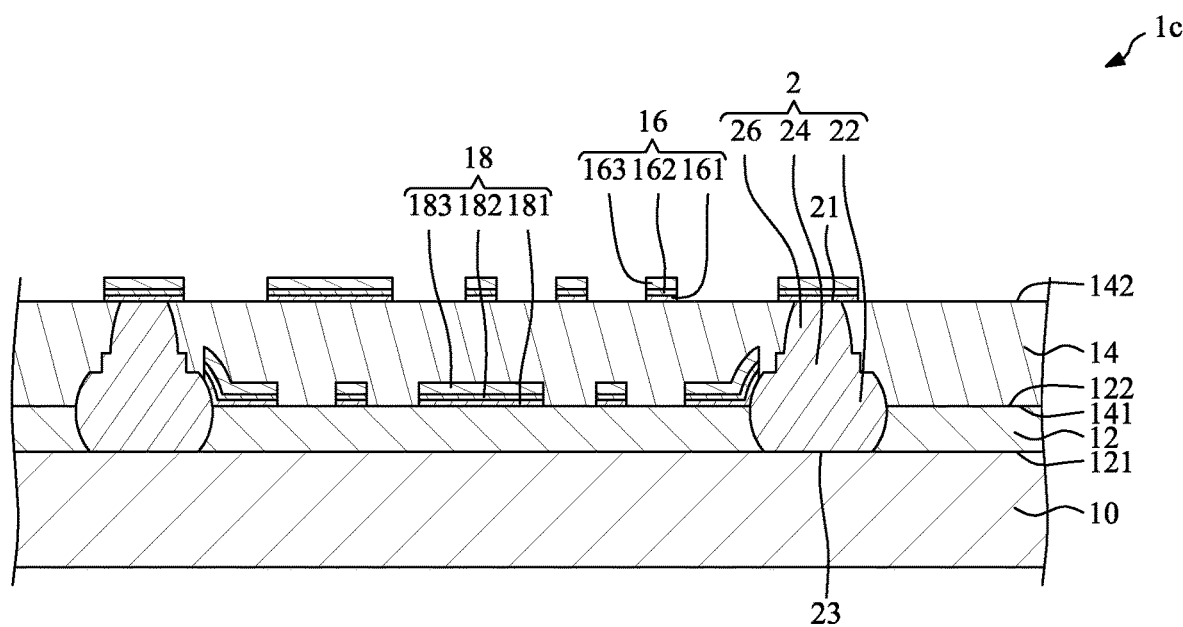
FIG. 5 illustrates a cross-sectional view of an electronic device according to some embodiments of the present disclosure.

FIG. 5 illustrates a cross-sectional view of an electronic device 1c according to some embodiments of the present disclosure. The electronic device 1c is similar to the electronic device 1 shown in FIG. 1 and FIG. 2, except that the lower circuit layer 18 contacts the bump portion 22 of the first stud bump 2. As shown in FIG. 4, a portion of the lower circuit layer 18 extends along the sidewall of the upper portion of the bump portion 22 of the first stud bump 2. In addition, the second stud bumps 3 of FIG. 1 may be omitted.

Figure 6:
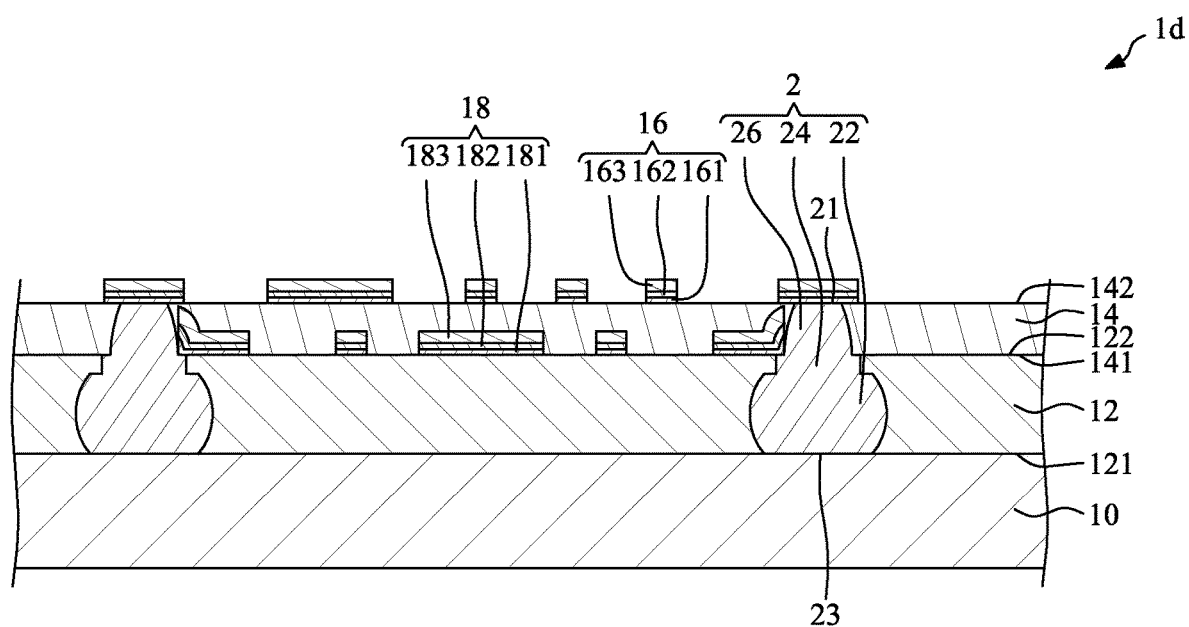
FIG. 6 illustrates a cross-sectional view of an electronic device according to some embodiments of the present disclosure.

FIG. 6 illustrates a cross-sectional view of an electronic device 1d according to some embodiments of the present disclosure. The electronic device 1d is similar to the electronic device 1c shown in FIG. 5, except that the boundary (e.g., the first surface 141 of the second dielectric layer 14 or the second surface 122 of the first dielectric layer 12) between the second dielectric layer 14 and the first dielectric layer 12 is higher than the top surface 221 of the bump portion 22 of the first stud bump 2. Thus, the first dielectric layer 12 covers the bump portion 22 of the first stud bump 2, and the second dielectric layer 14 does not contact the bump portion 22 of the first stud bump 2. The thickness of the second dielectric layer 14 may be less than the thickness of the first dielectric layer 12.

Figure 7:
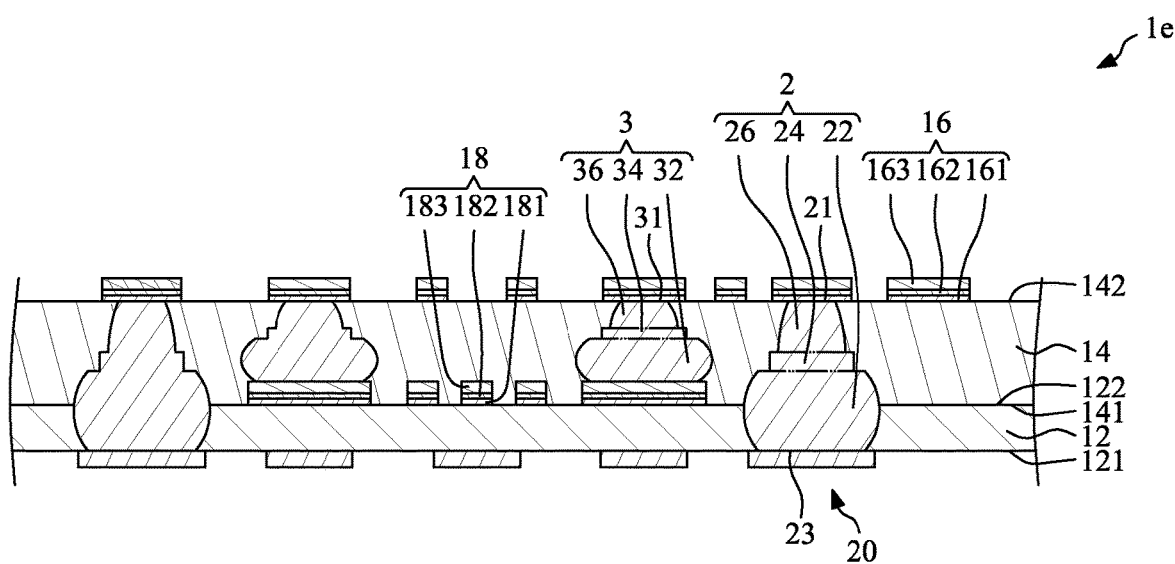
FIG. 7 illustrates a cross-sectional view of an electronic device according to some embodiments of the present disclosure.

FIG. 7 illustrates a cross-sectional view of an electronic device 1e according to some embodiments of the present disclosure. The electronic device 1e is similar to the electronic device 1b shown in FIG. 4, except that the carrier 10a is removed, and the metal layer 11 is patterned to form a bottom circuit layer 20. As shown in FIG. 7, a bottom surface (i.e., the first surface 121) of the first dielectric layer 12 is far away from the second dielectric layer 14, and is substantially coplanar with a bottom surface 23 of the first stud bump 2. Thus, the bottom circuit layer 20 is disposed on the bottom surface (i.e., the first surface 121) of the first dielectric layer 12, and covers and contacts the bottom surface 23 of the bump portion 22 of the first stud bump 2. The bottom circuit layer 20 is flat.

Figure 8:
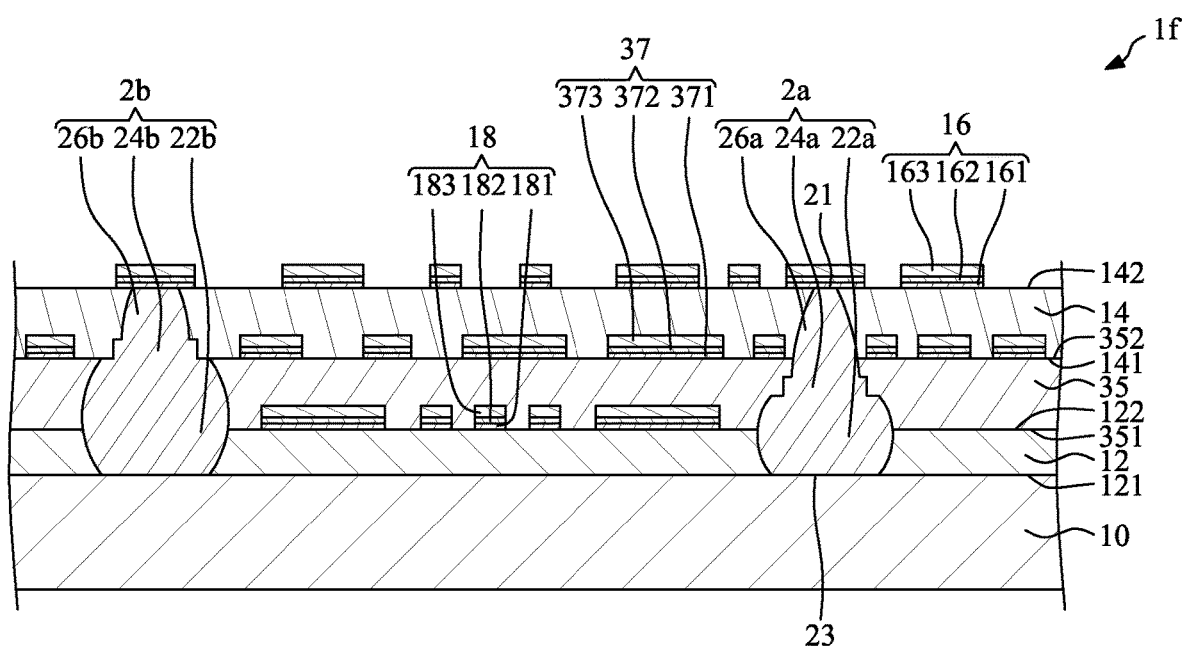
FIG. 8 illustrates a cross-sectional view of an electronic device according to some embodiments of the present disclosure.

FIG. 8 illustrates a cross-sectional view of an electronic device 1f according to some embodiments of the present disclosure. The electronic device 1f is similar to the electronic device 1 shown in FIG. 1 and FIG. 2, except that a third dielectric layer 35 and a third circuit layer 37 are further included. The third dielectric layer 35 is interposed between the first dielectric layer 12 and the second dielectric layer 14. A material of the third dielectric layer 35 may be the same as the material of the first dielectric layer 12 or the second dielectric layer 14. The third dielectric layer 35 covers the first dielectric layer 12, the lower circuit layer 18 and at least a portion of the first stud bumps 2a, 2b. The third circuit layer 37 may be a redistribution layer (RDL), and is disposed on the third dielectric layer 35. For example, the third circuit layer 37 may include a first metal layer 371, a second metal layer 372 and a third metal layer 373 disposed in that order on the first dielectric layer 12. The first metal layer 371 and the second metal layer 372 may be seed layers including, for example, titanium and/or copper, another metal, or an alloy, and may be formed or disposed by sputtering. For example, the first metal layer 371 may include titanium, and the second metal layer 372 may include copper. The third metal layer 373 may include, for example, copper, or another metal or combination of metals, and may be formed or disposed by electroplating. In some embodiments, as shown in FIG. 8, the third circuit layer 37 may include a plurality of conductive traces and/or a plurality of bonding pads. The third circuit layer 37 may not contact the first stud bumps 2a, 2b. However, in some embodiments, the third circuit layer 37 may contact the first stud bumps 2a, 2b. In one or more embodiments, a line width/line space (L/S) of the third circuit layer 37 may be equal to or less than about 3 μm/about 3 equal to or less than about 2 μm/about 2 μm.

The second dielectric layer 14 covers the third dielectric layer 35, the third circuit layer 37 and at least a portion of the first stud bumps 2a, 2b. The upper circuit layer 16 may be a redistribution layer (RDL), and is disposed on the second surface 142 of the second dielectric layer 14. Portions of the upper circuit layer 16 may cover and contact the top surfaces of the first stud bumps 2a, 2b. As shown in FIG. 8, the second stud bumps 3 of FIG. 1 may be omitted, and the shapes of the first stud bumps 2a, 2b are different from the shape of the first stud bump 2 of FIG. 1 and FIG. 2. The first stud bump 2a may include a bump portion 22a, a shoulder portion 24a and a stud portion 26a. A height of the stud portion 26a of the first stud bump 2a may be greater than the height of the stud portion 26 of the first stud bump 2. The stud portion 26a of the first stud bump 2a extends through the third circuit layer 37. The first stud bump 2b may include a bump portion 22b, a shoulder portion 24b and a stud portion 26b. A height of the bump portion 22b of the first stud bump 2b may be greater than the height of the bump portion 22 of the first stud bump 2. Therefore, a density of the third circuit layer 37 near the first stud bump 2a is greater than a density of the third circuit layer 37 near the first stud bump 2b. In addition, the height of the stud portion 26a of the first stud bump 2a may be different from a height of the stud portion 26b of the first stud bump 2b. In some embodiments, the height of the stud portion 26a of the first stud bump 2a may be greater than the height of the stud portion 26b of the first stud bump 2b.

Figure 9:
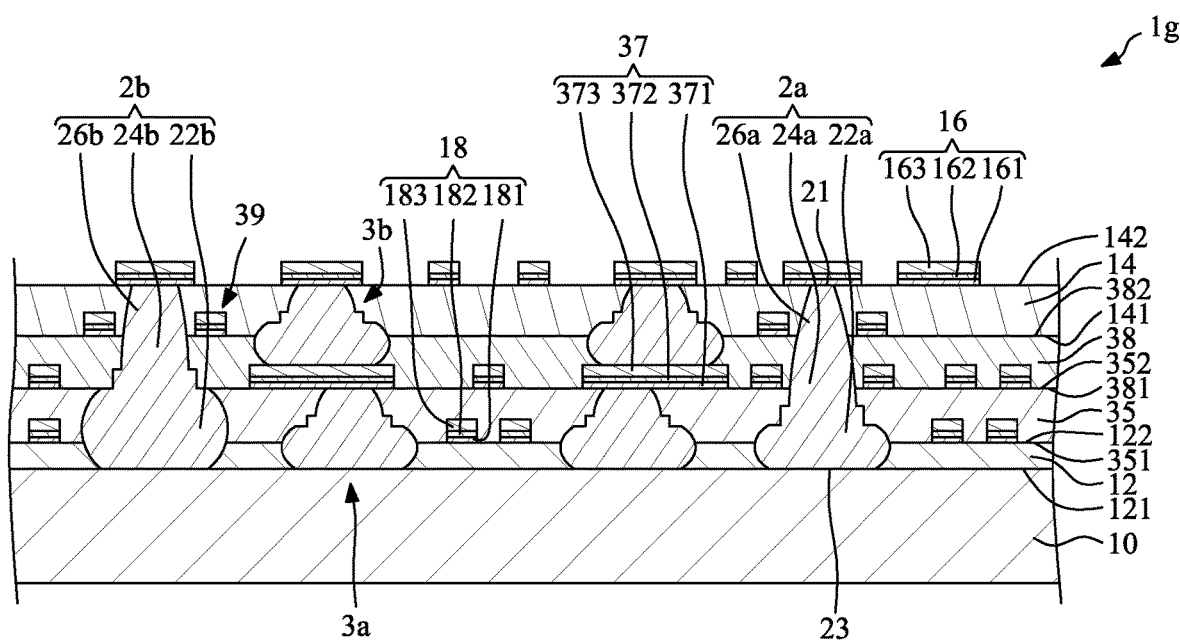
FIG. 9 illustrates a cross-sectional view of an electronic device according to some embodiments of the present disclosure.

FIG. 9 illustrates a cross-sectional view of an electronic device 1g according to some embodiments of the present disclosure. The electronic device 1g is similar to the electronic device if shown in FIG. 8, except that a fourth dielectric layer 38 and a fourth circuit layer 39 are further included. The fourth dielectric layer 38 is interposed between the third dielectric layer 35 and the second dielectric layer 14. The fourth circuit layer 39 is disposed on the fourth dielectric layer 38. In one or more embodiments, a line width/line space (L/S) of the fourth circuit layer 39 may be equal to or less than about 3 μm/about 3 μm, equal to or less than about 2 μm/about 2 μm. The second dielectric layer 14 covers the fourth dielectric layer 38, the fourth circuit layer 39 and at least a portion of the first stud bumps 2a, 2b. The upper circuit layer 16 is disposed on the second surface 142 of the second dielectric layer 14. Portions of the upper circuit layer 16 may cover and contact the top surfaces of the first stud bumps 2a, 2b. As shown in FIG. 9, the electronic device 1g may include a plurality of second stud bumps 3a, 3b. The second stud bumps 3a may be disposed in the first dielectric layer 12 and the third dielectric layer 32, and may contact the third circuit layer 37. The second stud bumps 3b may be disposed in the second dielectric layer 14 and the fourth dielectric layer 38, and may electrically connect the third circuit layer 37 and the upper circuit layer 16.

Figure 10:
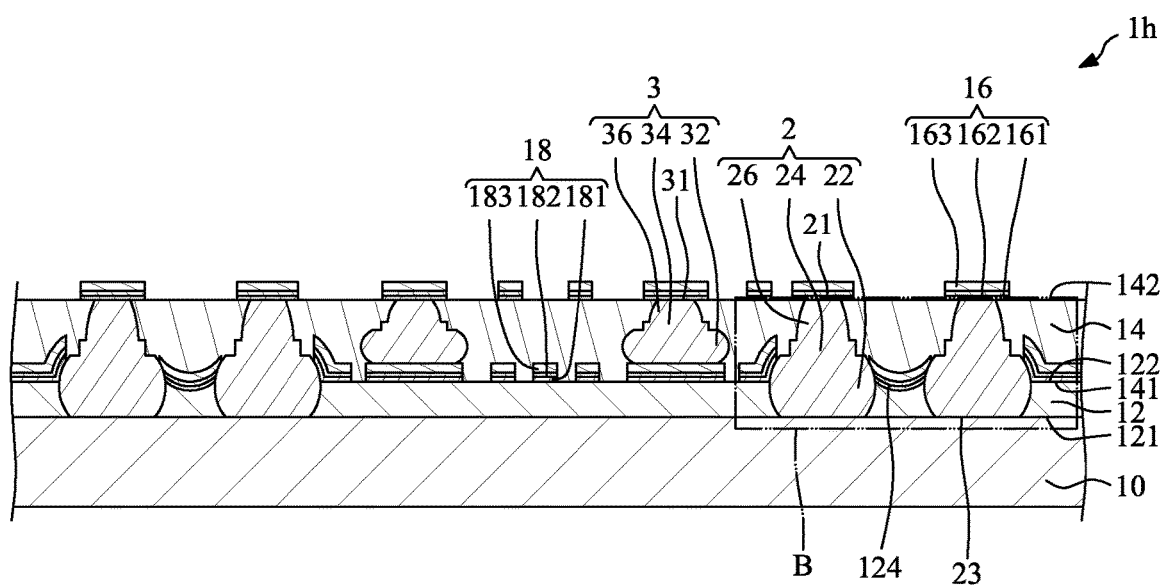
FIG. 10 illustrates a cross-sectional view of an electronic device according to some embodiments of the present disclosure.
Figure 11:
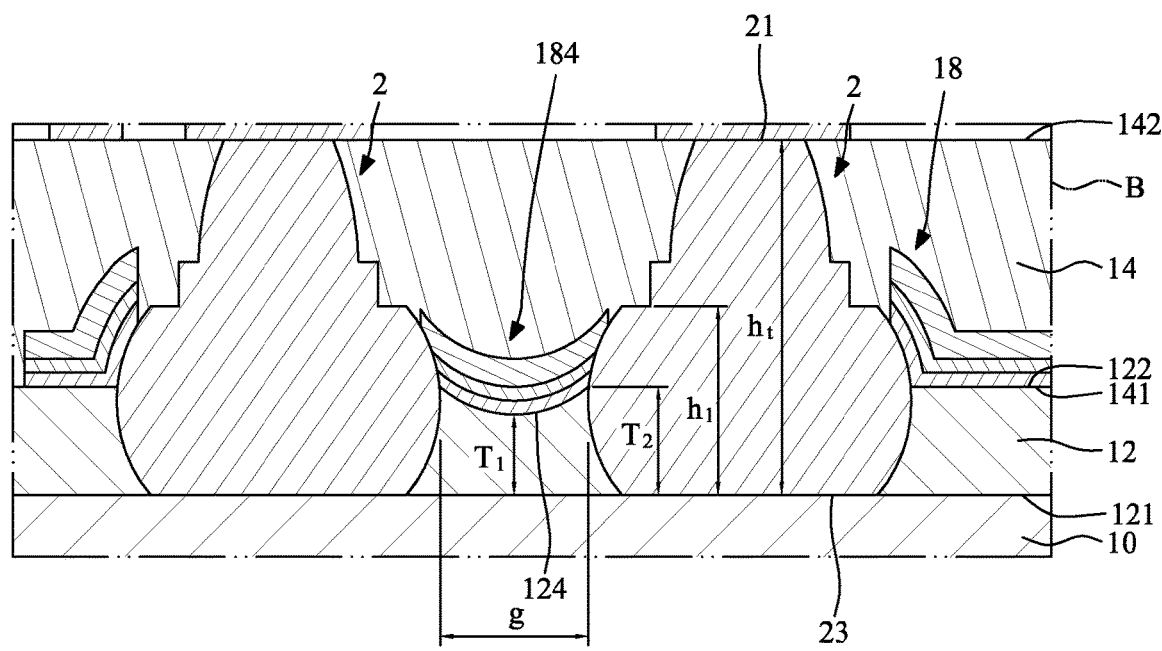
FIG. 11 illustrates an enlarged view of an area "B" shown in FIG. 10.

FIG. 10 illustrates a cross-sectional view of an electronic device 1h according to some embodiments of the present disclosure. FIG. 11 illustrates an enlarged view of an area "B" shown in FIG. 10. The electronic device 1h is similar to the electronic device 1 shown in FIG. 1 and FIG. 2, except that the electronic device 1h includes a plurality of first stud bumps 2, and the first dielectric layer 12 defines a first recess portion 124 between two adjacent first stud bumps 2. A portion of a conductive trace 184 of the lower circuit layer 18 may be disposed in the first recess portion 124 and contact the two adjacent first stud bumps 2. Referring to FIG. 11, a thickness "$T_1$" is defined as the distance between the bottommost point of the first recess portion 124 and the first surface 121 of the first dielectric layer 12. That is, the thickness $T_1$ is the thinnest portion of the first dielectric layer 12. Further, a thickness "$T_2$" is defined as the distance between the topmost point of the first recess portion 124 and the first surface 121 of the first dielectric layer 12. In some embodiments, the topmost point of the first recess portion 124 may contact the sidewall of the bump portion 22 of the first stud bump 2. Thus, the thickness $T_2$ may be equal to or less than the average thickness of the first dielectric layer 12. Furthermore, a gap "g" is defined as a gap between the two adjacent first stud bumps 2. As shown in FIG. 11, the electronic device 1h satisfies a predetermined design rule of g>0.2*$h_1$, that is, the gap g between the two adjacent first stud bumps 2 is greater than 0.2 times a height $h_1$ of the bump portion 22 of the first stud bump 2. Thus, 0.04*$h_1$<$T_1$<$h_1$, and 0.06*$h_1$<$T_2$<$h_1$ due to the process capability and material characteristic. As a result, the portion of the conductive trace 181 of the lower circuit layer 18 in the first recess portion 124 can be ensured to contact the two adjacent first stud bumps 2.

Figure 12:
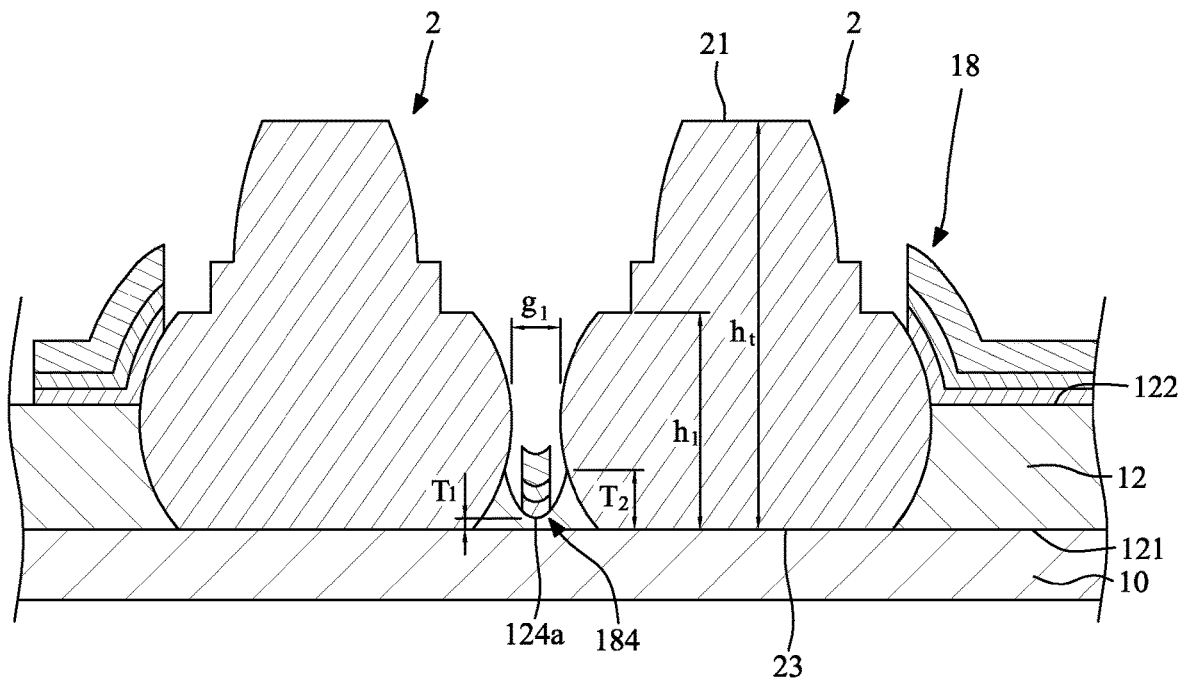
FIG. 12 illustrates an enlarged view of a cross-sectional view of an electronic device according to some embodiments of the present disclosure.
Figure 13:
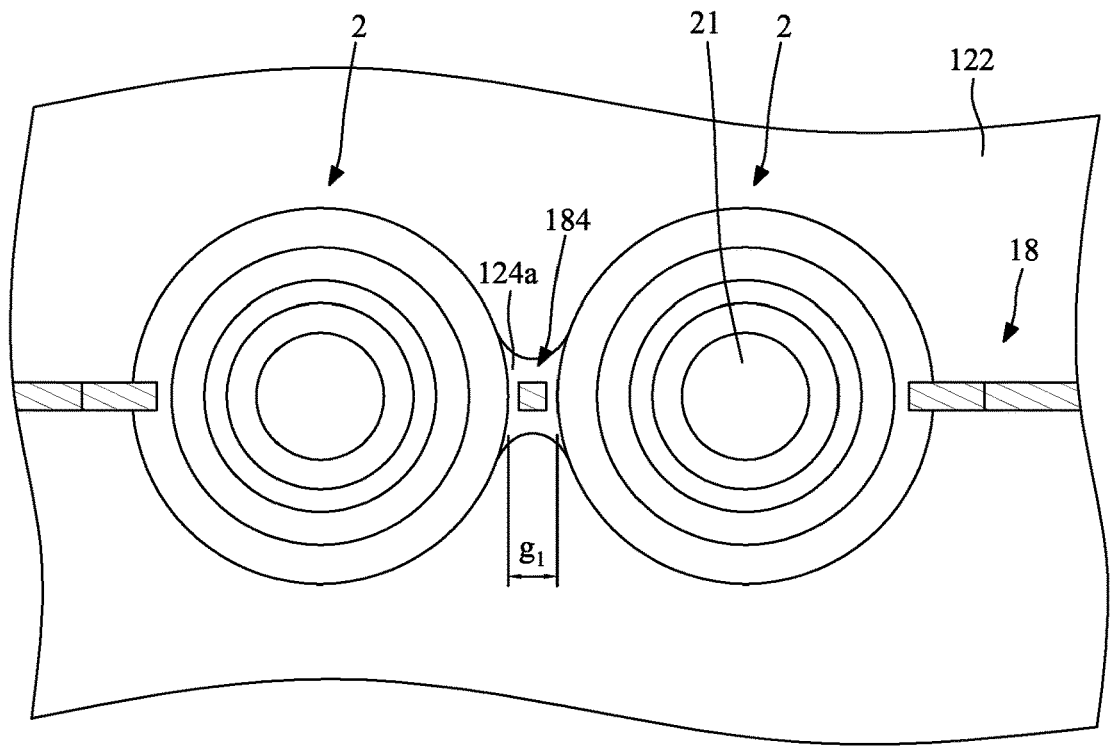
FIG. 13 illustrates a top view of FIG. 12.

FIG. 12 illustrates an enlarged view of a cross-sectional view of an electronic device according to some embodiments of the present disclosure. FIG. 13 illustrates a top view of FIG. 12. In the embodiment illustrated in FIG. 12 and FIG. 13, the upper circuit layer 16 and the second dielectric layer 14 are omitted for clear explanation. The first dielectric layer 12 defines a first recess portion 124a between two adjacent first stud bumps 2, and the gap $g_1$ between the two adjacent first stud bumps 2 is less than 0.2 times a height $h_1$ of the bump portion 22 of the first stud bump 2. That is, $g_1$<0.2*$h_1$. Thus, $T_1$<0.004*$h_1$ due to the process capability and material characteristic. Since the thickness $T_1$ is too small (i.e., very close to zero), the portion of the conductive trace 184 of the lower circuit layer 18 in the first recess portion 124a may not contact the two adjacent first stud bumps 2.

Figure 14:
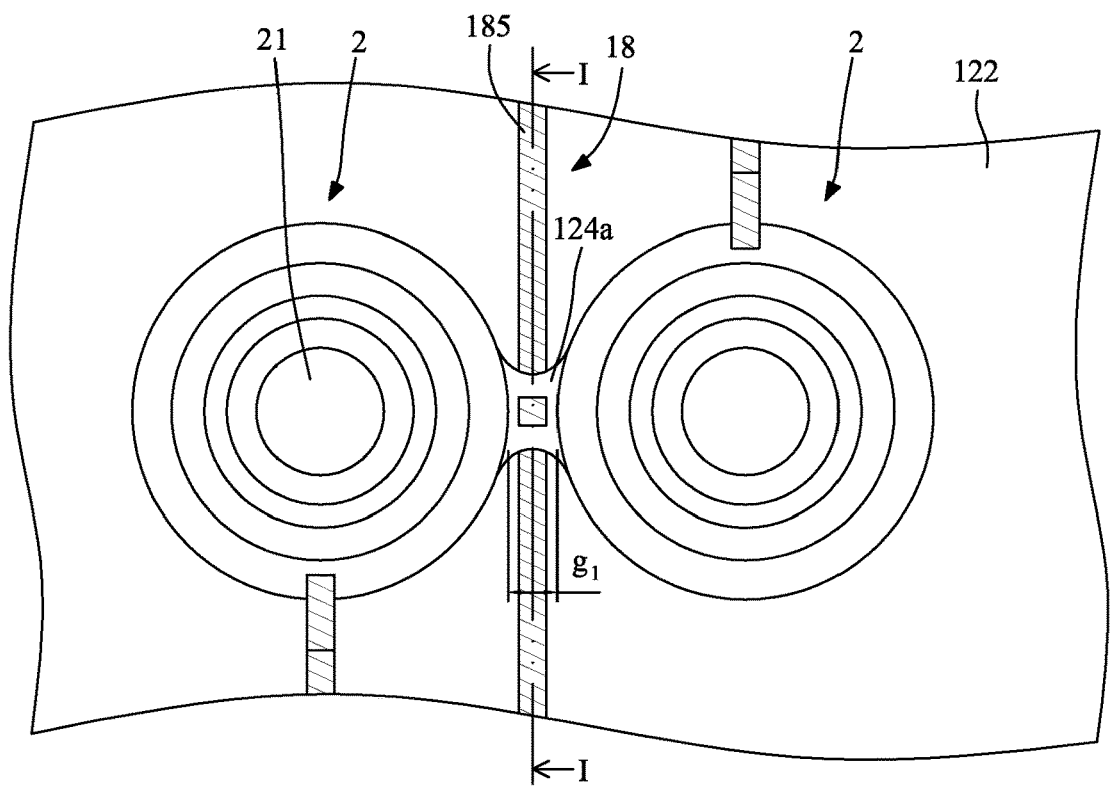
FIG. 14 illustrates an enlarged top view of an electronic device according to some embodiments of the present disclosure.
Figure 15:
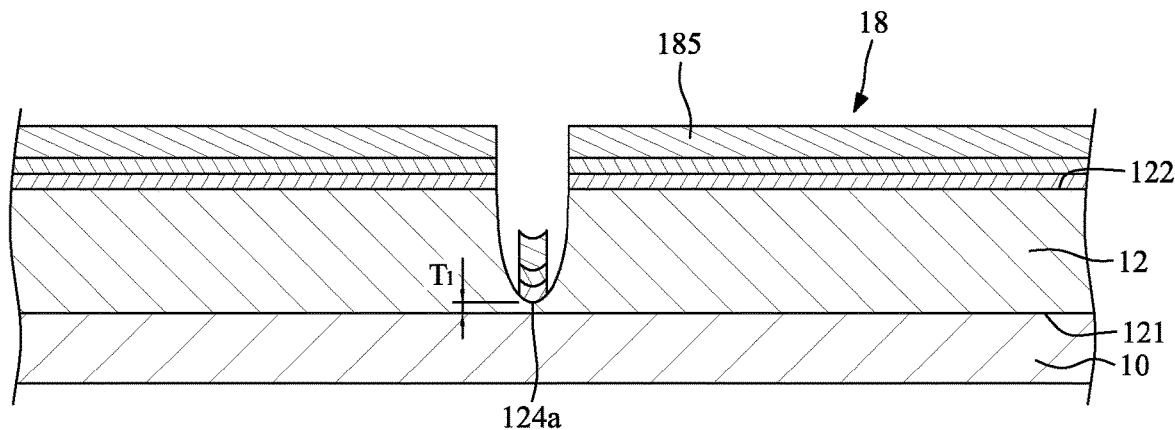
FIG. 15 illustrates a cross-sectional view taken along line I-I of FIG. 14.

FIG. 14 illustrates an enlarged top view of an electronic device according to some embodiments of the present disclosure. FIG. 15 illustrates a cross-sectional view taken along line I-I of FIG. 14. The embodiment illustrated in FIG. 14 and FIG. 15 is similar to the embodiment illustrated in FIG. 12 and FIG. 13, except for the orientation of the conductive trace of the lower circuit layer 18. Referring to FIG. 14, a conductive trace 185 of the lower circuit layer 18 extends vertically, and is disposed between the two adjacent first stud bumps 2. A portion of the conductive trace 185 of the lower circuit layer 18 may be disposed in the first recess portion 124a of the first dielectric layer 12. The gap $g_1$ between the two adjacent first stud bumps 2 is less than 0.2 times a height $h_1$ of the bump portion 22 of the first stud bump 2. That is, $g_1<0.2*h_1$. Thus, $T_1<0.004*h_1$ due to the process capability and material characteristic. Since the thickness $T_1$ is too small (i.e., very close to zero), the portion of the conductive trace 185 of the lower circuit layer 18 in the first recess portion 124a may not contact the other portion of the conductive trace 185 of the lower circuit layer 18 on the first dielectric layer 12. Therefore, the conductive trace 185 of the lower circuit layer 18 is discontinuous at the first recess portion 124a, which results in an open circuit.

Figure 16:
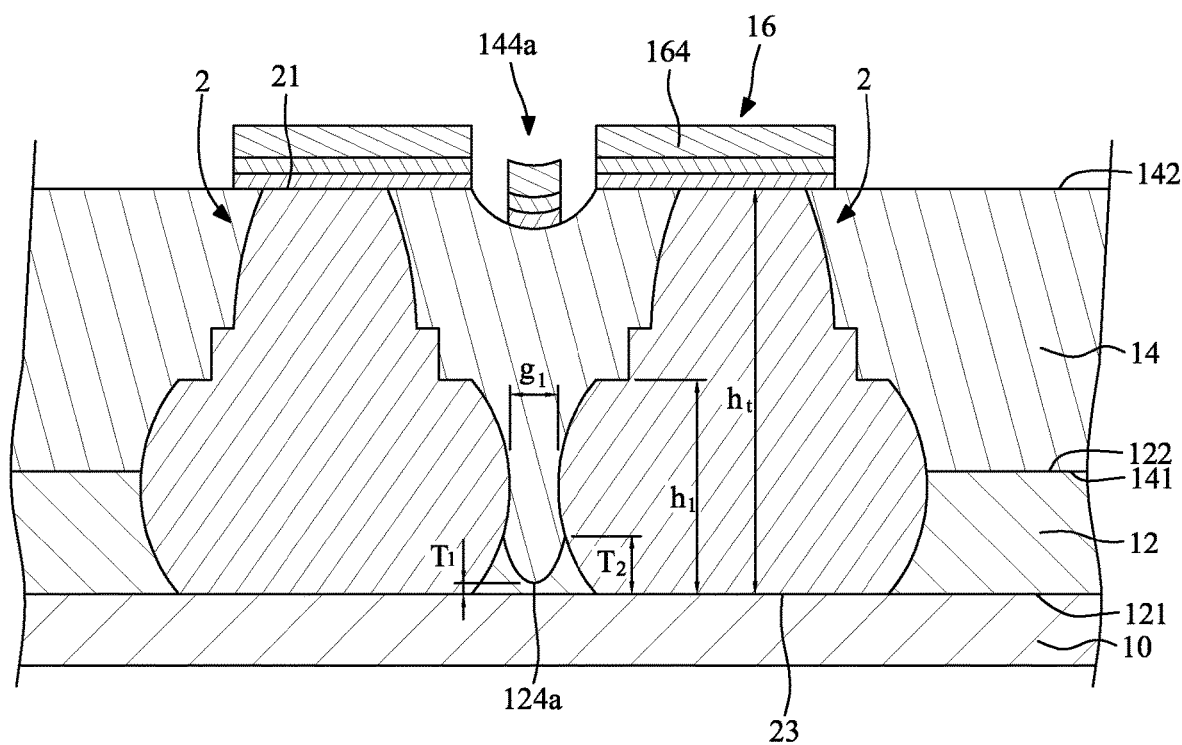
FIG. 16 illustrates an enlarged view of a cross-sectional view of an electronic device according to some embodiments of the present disclosure.
Figure 17:
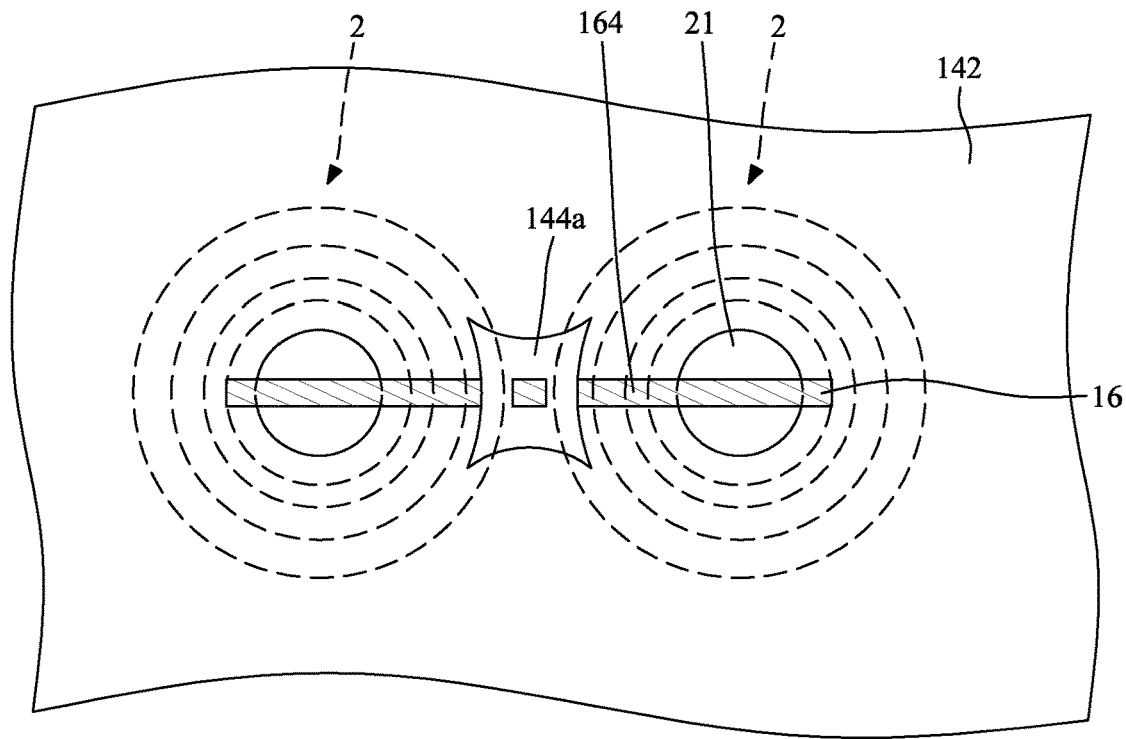
FIG. 17 illustrates a top view of FIG. 16.

FIG. 16 illustrates an enlarged view of a cross-sectional view of an electronic device according to some embodiments of the present disclosure. FIG. 17 illustrates a top view of FIG. 16. In the embodiment illustrated in FIG. 16 and FIG. 17, the lower circuit layer 18 is omitted for clear explanation. The second dielectric layer 14 defines a second recess portion 144a corresponding to the first recess portion 124a of the first dielectric layer 12. A portion of a conductive trace 164 of the upper circuit layer 16 may be disposed in the second recess portion 144a of the second dielectric layer 14. As shown in FIG. 16, the second recess portion 144a of the second dielectric layer 14 is conformal with the first recess portion 124a of the first dielectric layer 12. Thus, the portion of the conductive trace 164 of the upper circuit layer 16 in the second recess portion 144a of the second dielectric layer 14 may not contact the other portion of the conductive trace 164 of the upper circuit layer 16 on the second dielectric layer 14. Therefore, the conductive trace 164 of the upper circuit layer 16 is discontinuous at the second recess portion 144a, which results in an open circuit.

Figure 18:
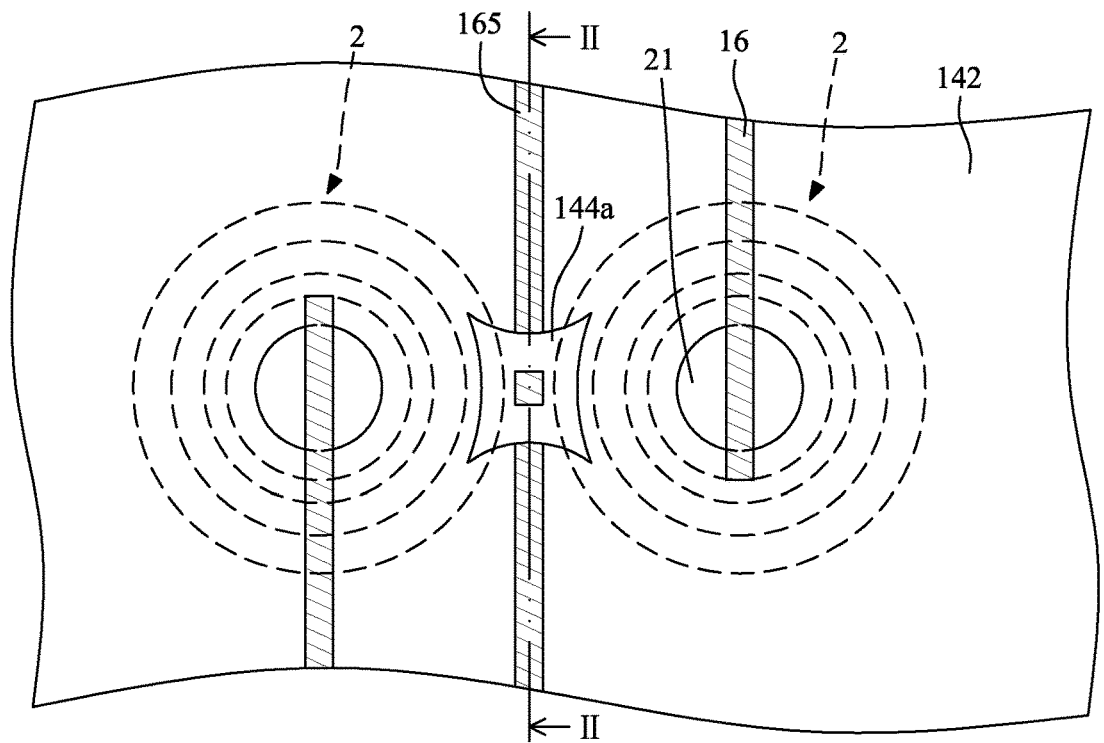
FIG. 18 illustrates an enlarged top view of an electronic device according to some embodiments of the present disclosure.
Figure 19:
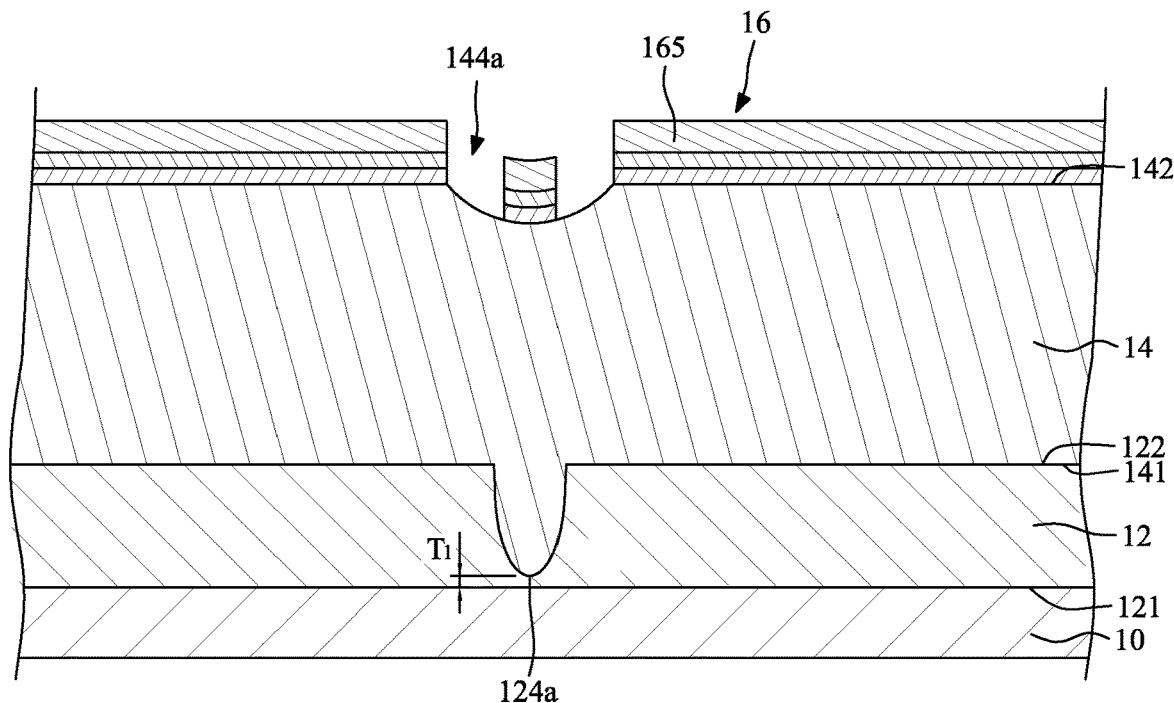
FIG. 19 illustrates a cross-sectional view taken along line II-II of FIG. 18.

FIG. 18 illustrates an enlarged top view of an electronic device according to some embodiments of the present disclosure. FIG. 19 illustrates a cross-sectional view taken along line II-II of FIG. 18. The embodiment illustrated in FIG. 18 and FIG. 19 is similar to the embodiment illustrated in FIG. 16 and FIG. 17, except for the orientation of the conductive trace of the upper circuit layer 16. Referring to FIG. 18, a conductive trace 165 of the upper circuit layer 16 extends vertically, and is disposed between the two adjacent first stud bumps 2. A portion of the conductive trace 165 of the upper circuit layer 16 may be disposed in the second recess portion 144a of the second dielectric layer 14. The portion of the conductive trace 165 of the upper circuit layer 16 in the second recess portion 144a may not contact the other portion of the conductive trace 165 of the upper circuit layer 16 on the second dielectric layer 14. Therefore, the conductive trace 165 of the upper circuit layer 16 is discontinuous at the second recess portion 144a, which results in an open circuit.

Figure 20:
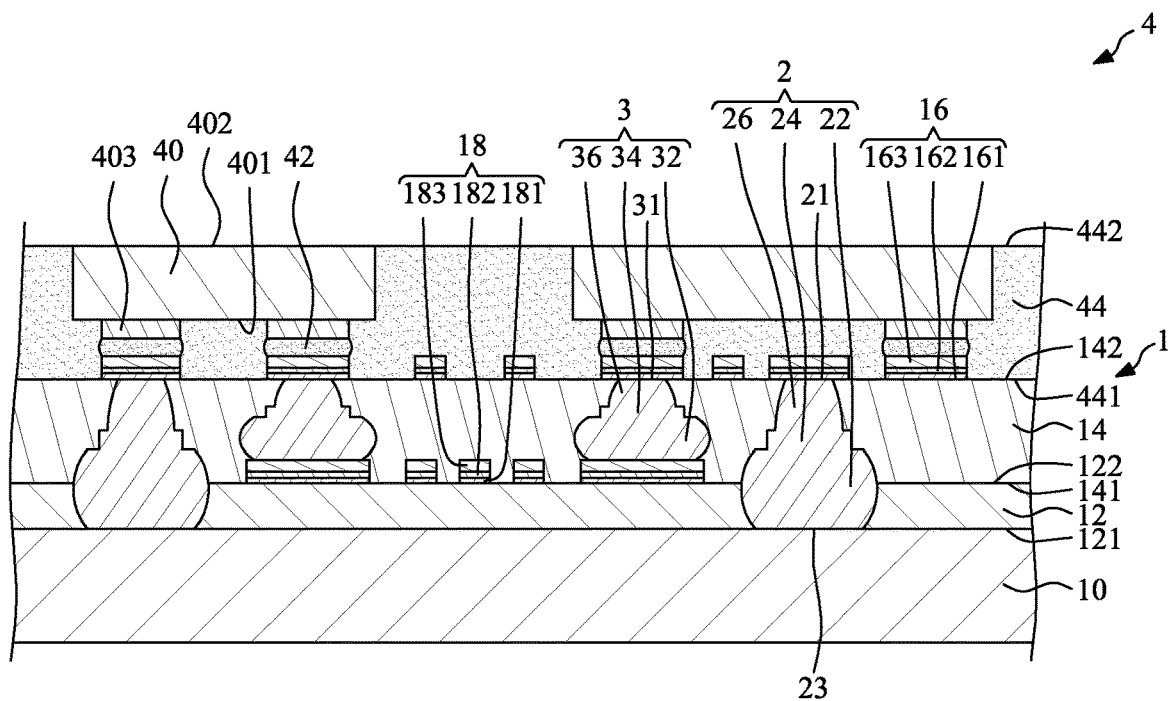
FIG. 20 illustrates a cross-sectional view of an electronic device according to some embodiments of the present disclosure.

FIG. 20 illustrates a cross-sectional view of an electronic device 4 according to some embodiments of the present disclosure. The electronic device 4 is similar to the electronic device 1 shown in FIGS. 1 to 2, except that the electronic device 4 in FIG. 20 further includes at least one electronic component 40 and an encapsulant 44. Thus, the electronic device 4 of FIG. 20 can be also referred to as "a semiconductor package".

The electronic component 40 is disposed on the electronic device 1. As shown in FIG. 20, the electronic component 40 is disposed adjacent to the second surface 142 of the second dielectric layer 14 and is electrically connected to the upper circuit layer 16. For example, the electronic component 40 may be a semiconductor die. The electronic component 40 has a first surface 401 (e.g., an active surface) and a second surface 402 (e.g., a backside surface) opposite to the first surface 401. Further, the electronic component 40 includes, or is electrically connected to, at least one conductive pillar 403 and at least one solder bump 42 sequentially disposed on the first surface 401 of the electronic component 40. The solder bump 42 is electrically connected to the bonding pads of the upper circuit layer 16. Thus, the electronic component 40 is attached to the electronic device 1 by flip-chip bonding.

The encapsulant 44, such as a molding compound, is disposed on the second surface 142 of the second dielectric layer 14 and covers the electronic component 40, the conductive pillar 403, the solder bump 42 and the upper circuit layer 16. The encapsulant 44 has a first surface 441 and a second surface 442 opposite to the first surface 441. The second surface 442 of the encapsulant 44 may be substantially coplanar with the second surface 402 of the electronic component 40. Thus, the second surface 402 of the electronic component 40 may be exposed from the second surface 442 of the encapsulant 44.

Figure 21:
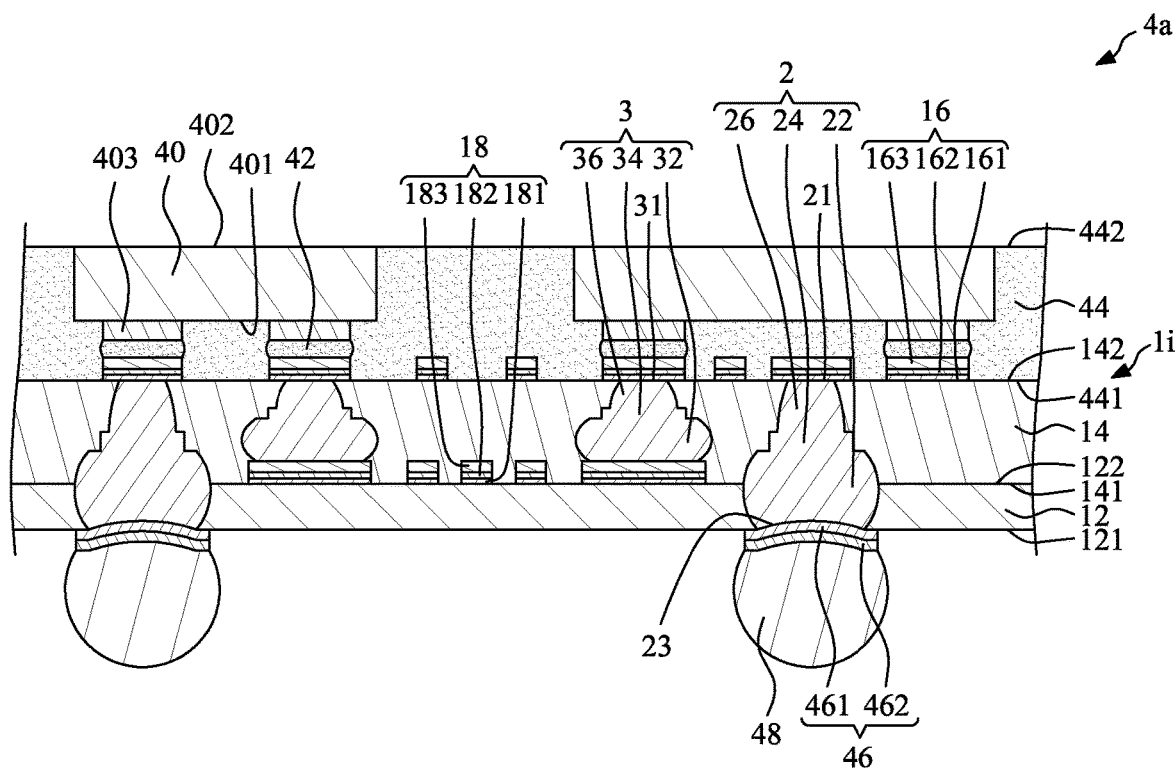
FIG. 21 illustrates a cross-sectional view of an electronic device according to some embodiments of the present disclosure.

FIG. 21 illustrates a cross-sectional view of an electronic device 4a according to some embodiments of the present disclosure. The electronic device 4a is similar to the electronic device 4 shown in FIG. 20, except for the structure of the electronic device 1i. As shown in FIG. 21, the carrier 10 (FIG. 20) is removed, and the bottom surface 23 of the bump portion 22 of the first stud bump 2 is recessed from the first surface 121 (i.e., bottom surface) of the first dielectric layer 12. In addition, a seed layer 46 is formed or disposed on the bottom surface 23 of the bump portion 22 of the first stud bump 2, and an external connector 48 is formed or disposed on the seed layer 46. For example, the seed layer 46 may include a first metal layer 461 and a second metal layer 462 disposed in that order on the bump portion 22 of the first stud bump 2. For example, the first metal layer 461 may include titanium, and the second metal layer 462 may include copper, and may be formed or disposed by sputtering. A material of the external connector 48 may be a conductive metal, such as, for example, tin and/or silver, or another metal or combination of metals.

Figure 22:
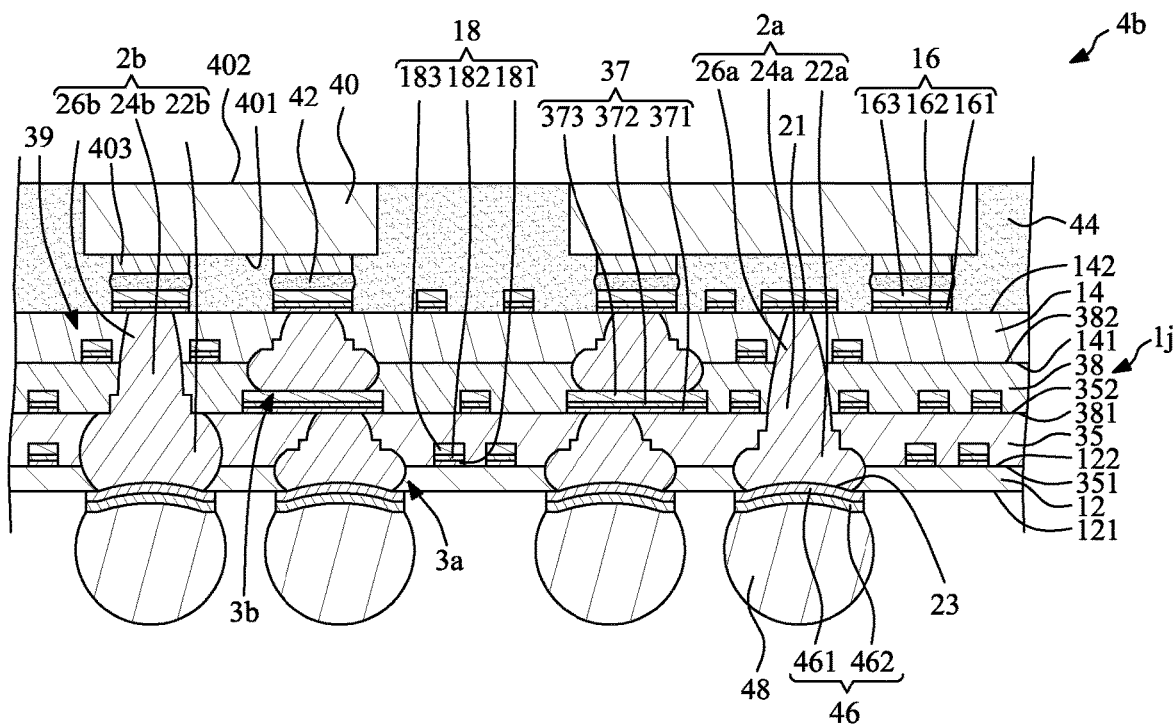
FIG. 22 illustrates a cross-sectional view of an electronic device according to some embodiments of the present disclosure.

FIG. 22 illustrates a cross-sectional view of an electronic device 4b according to some embodiments of the present disclosure. The electronic device 4b is similar to the electronic device 4a shown in FIG. 21, except for the structure of the electronic device 1j. As shown in FIG. 22, a third dielectric layer 35, a third circuit layer 37, a fourth dielectric layer 38 and a fourth circuit layer 39 are further included. It is noted that the third dielectric layer 35, the third circuit layer 37, the fourth dielectric layer 38 and the fourth circuit layer 39 of FIG. 22 may be the same as the third dielectric layer 35, the third circuit layer 37, the fourth dielectric layer 38 and the fourth circuit layer 39 of FIG. 8 and FIG. 9. In addition, the seed layer 46 and the external connector 48 are further formed or disposed on the recessed bottom surface of the second stud bump 3a.

Figure 23:
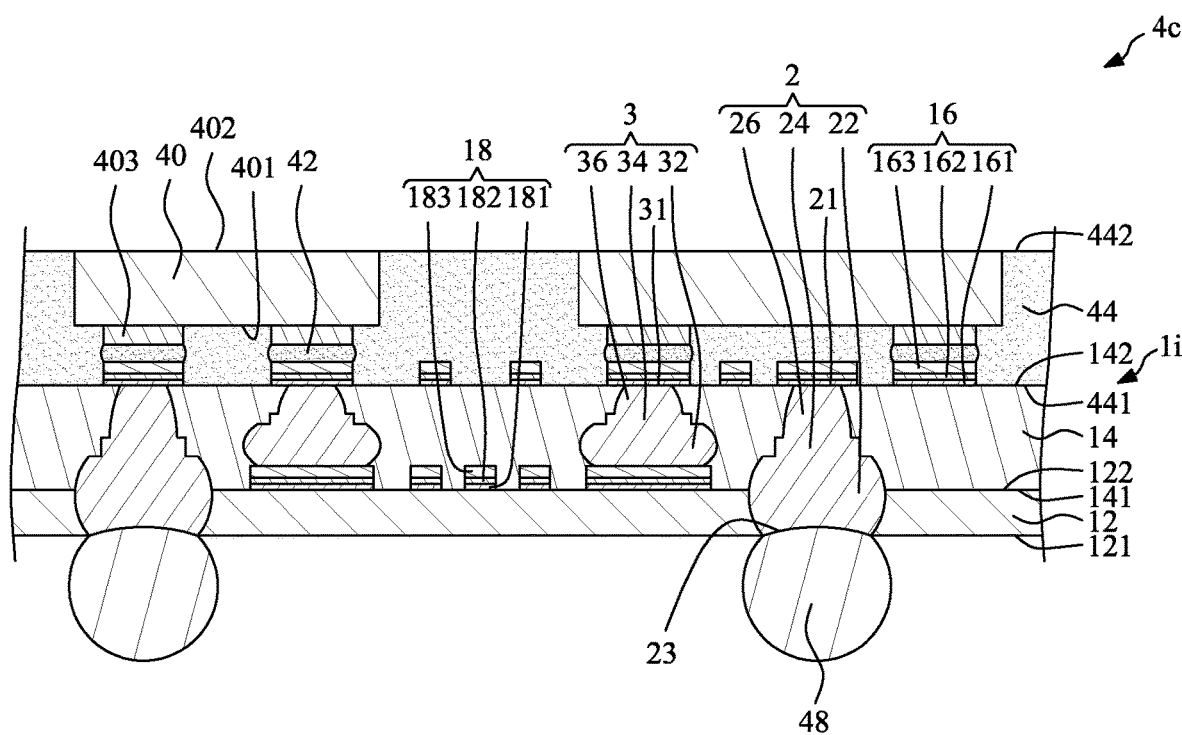
FIG. 23 illustrates a cross-sectional view of an electronic device according to some embodiments of the present disclosure.

FIG. 23 illustrates a cross-sectional view of an electronic device 4c according to some embodiments of the present disclosure. The electronic device 4c is similar to the electronic device 4a shown in FIG. 21, except that the seed layer 46 is omitted, and the external connector 48 is formed or disposed on the bottom surface 23 of the bump portion 22 of the first stud bump 2 directly.

Figure 24:
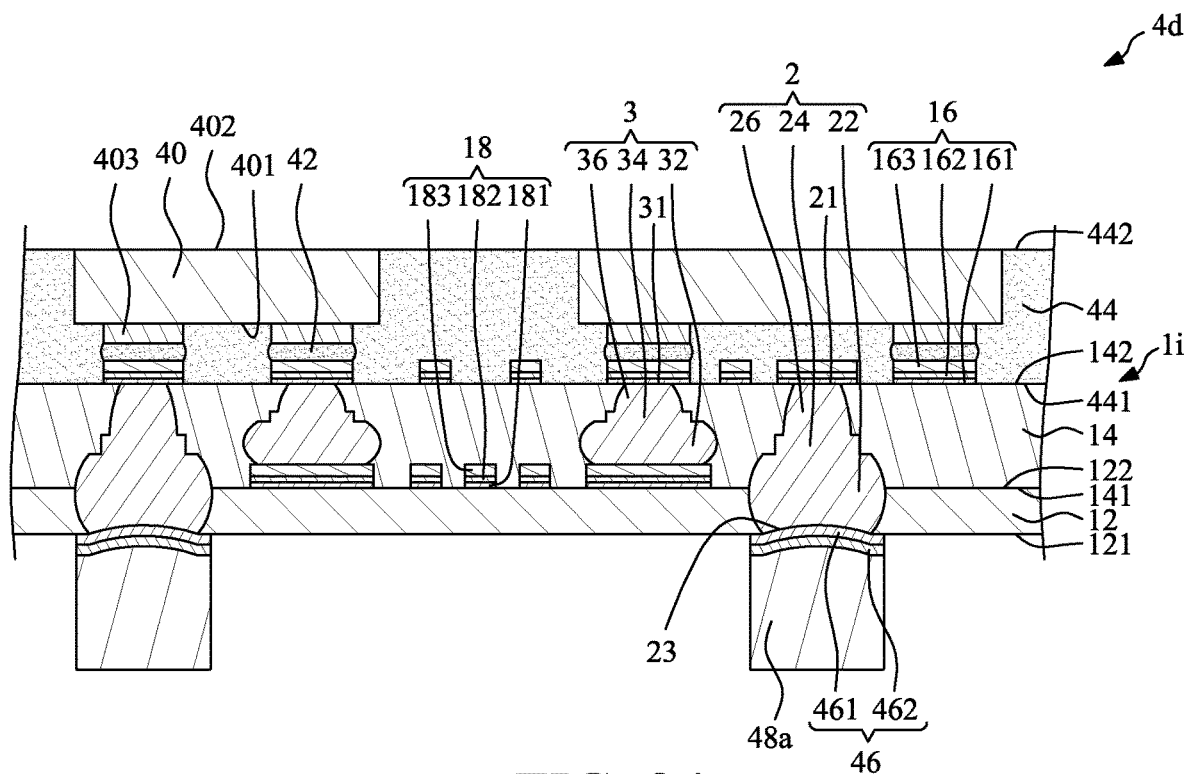
FIG. 24 illustrates a cross-sectional view of an electronic device according to some embodiments of the present disclosure.

FIG. 24 illustrates a cross-sectional view of an electronic device 4d according to some embodiments of the present disclosure. The electronic device 4d is similar to the electronic device 4a shown in FIG. 21, except that the external connector 48 is in a cubic pillar shape rather than a ball shape.

Figure 25:
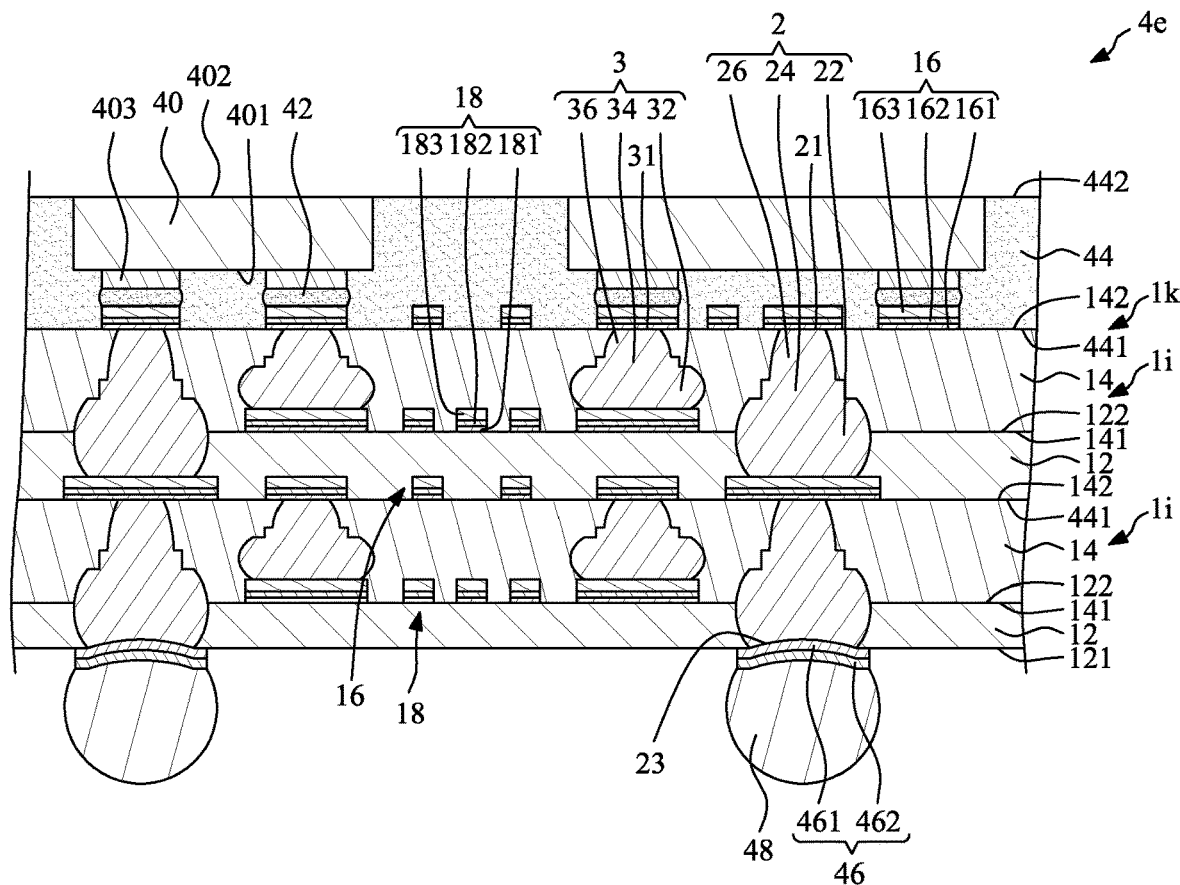
FIG. 25 illustrates a cross-sectional view of an electronic device according to some embodiments of the present disclosure.

FIG. 25 illustrates a cross-sectional view of an electronic device 4e according to some embodiments of the present disclosure. The electronic device 4e is similar to the electronic device 4a shown in FIG. 21, except for the structure of the electronic device 1k. As shown in FIG. 25, the electronic device 1k is formed by two stacked electronic devices 1i.

Figure 26:
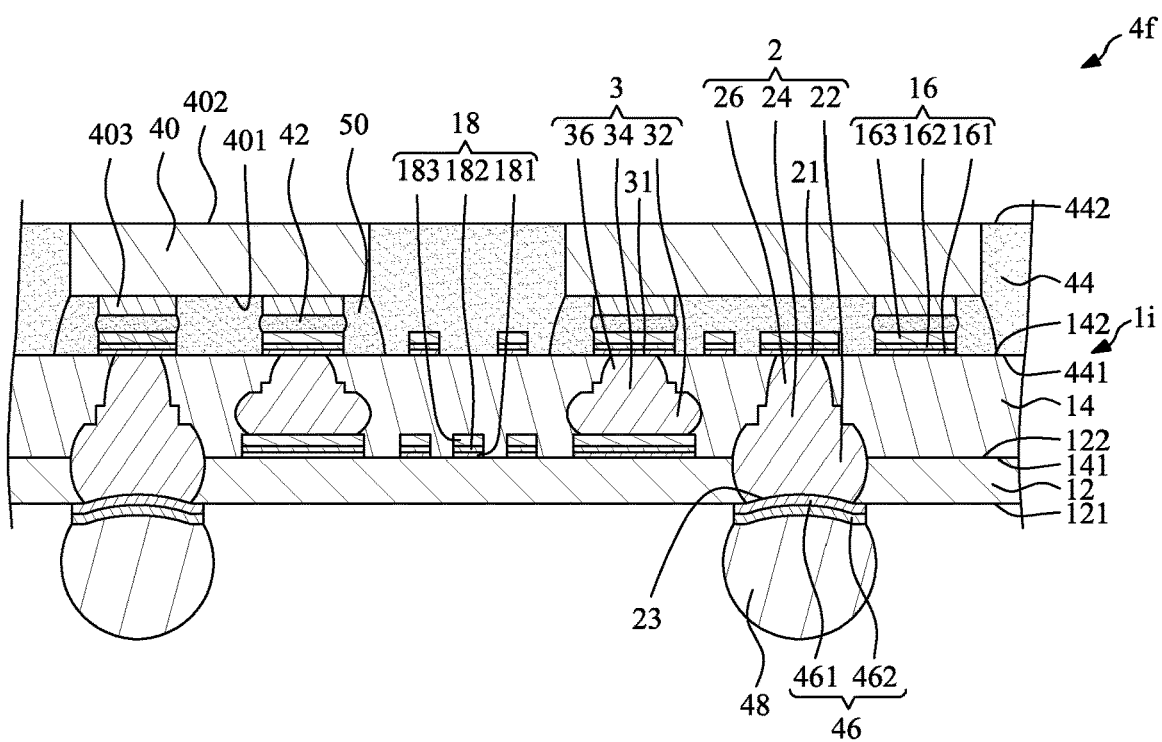
FIG. 26 illustrates a cross-sectional view of an electronic device according to some embodiments of the present disclosure.

FIG. 26 illustrates a cross-sectional view of an electronic device 4f according to some embodiments of the present disclosure. The electronic device 4f is similar to the electronic device 4a shown in FIG. 21, except that an underfill 50 is further included between the electronic component 40 and the second dielectric layer 14, and covers the first surface 401, the conductive pillar 403 and the solder bump 42 of the electronic component 40.

Figure 27:
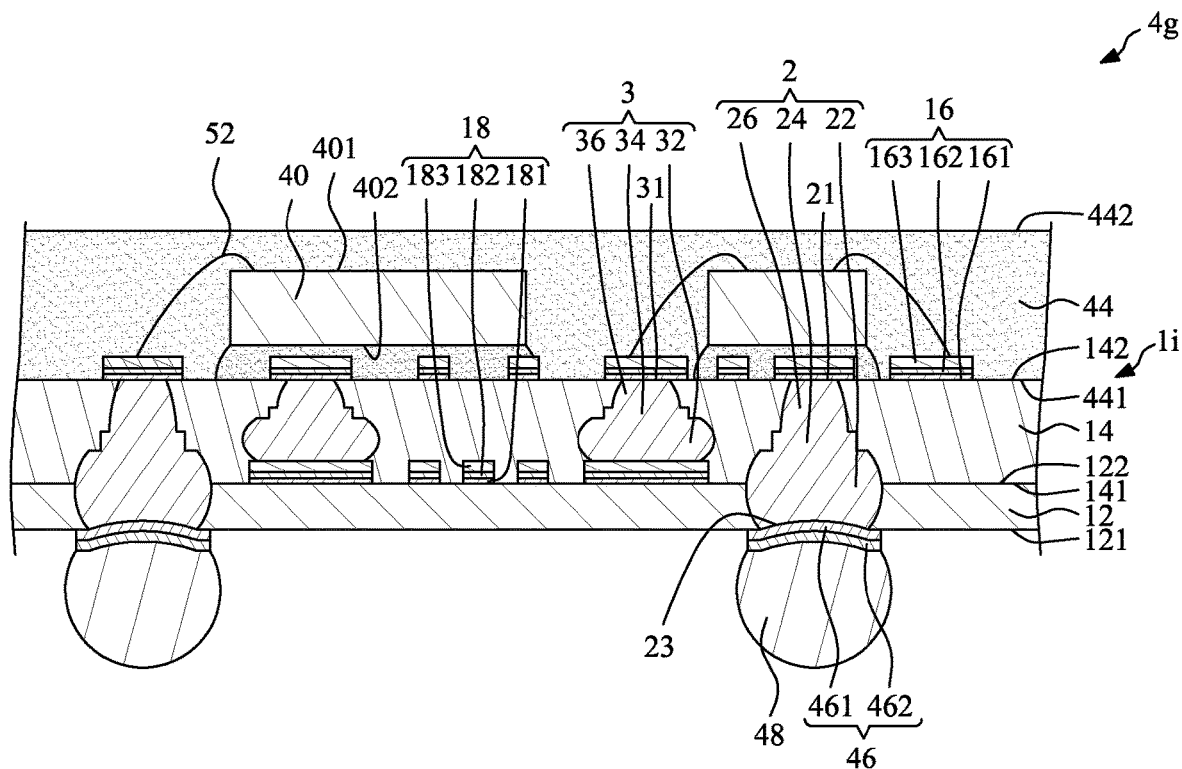
FIG. 27 illustrates a cross-sectional view of an electronic device according to some embodiments of the present disclosure.

FIG. 27 illustrates a cross-sectional view of an electronic device 4g according to some embodiments of the present disclosure. The electronic device 4g is similar to the electronic device 4a shown in FIG. 21, except that the electronic component 40 is attached to the electronic device 1i by wire-bonding. That is, the second surface 402 of the electronic component 40 is adhered to the second surface 402 of the second dielectric layer 14, and the first surface 401 of the electronic component 40 is electrically connected to the upper circuit layer 16 by bonding wire 52.

Figure 28:
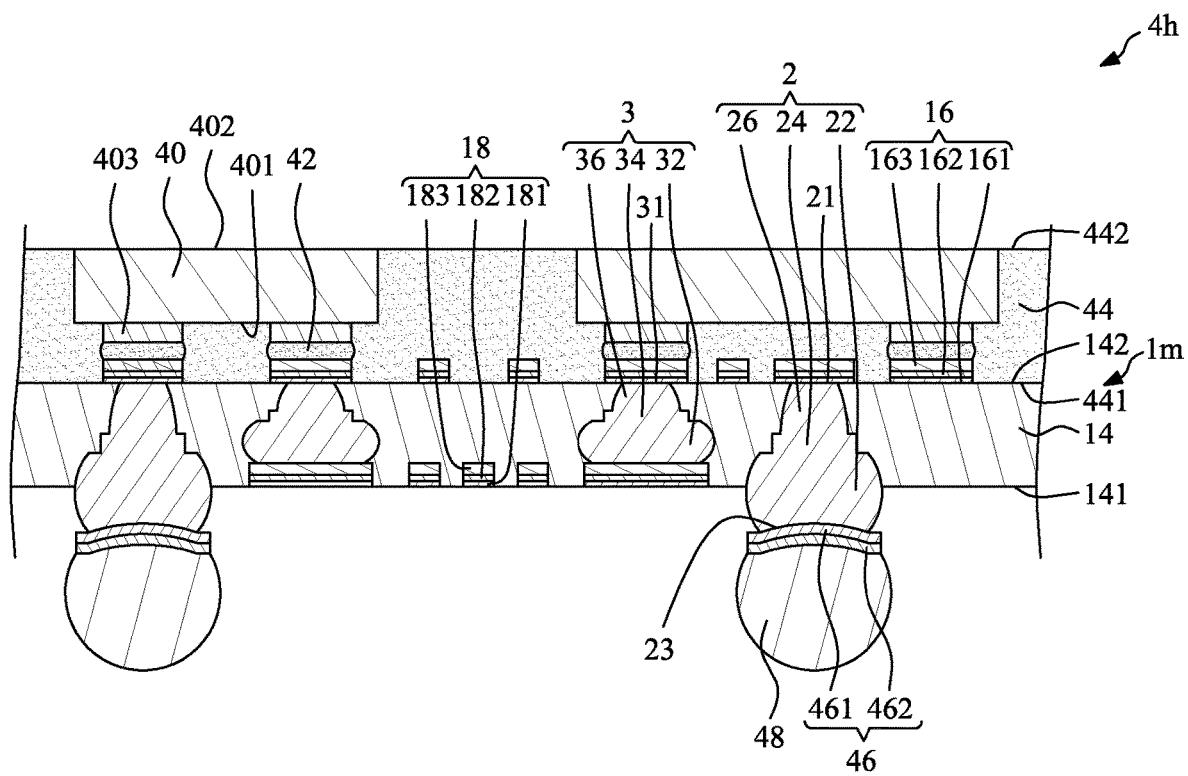
FIG. 28 illustrates a cross-sectional view of an electronic device according to some embodiments of the present disclosure.

FIG. 28 illustrates a cross-sectional view of an electronic device 4h according to some embodiments of the present disclosure. The electronic device 4h is similar to the electronic device 4a shown in FIG. 21, except for the structure of the electronic device 1m. In the electronic device 1m of FIG. 28, the first dielectric layer 12 of FIG. 21 is removed so that the lower circuit layer 18 is exposed.

Figure 29:
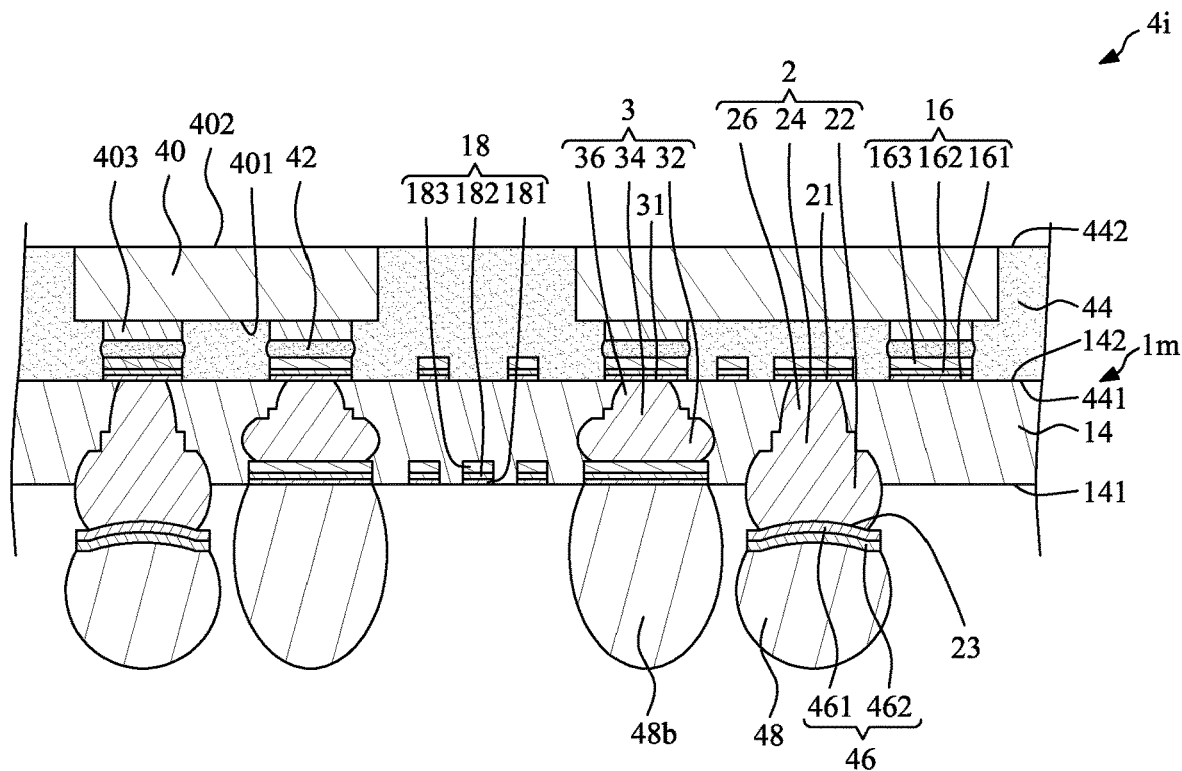
FIG. 29 illustrates a cross-sectional view of an electronic device according to some embodiments of the present disclosure.

FIG. 29 illustrates a cross-sectional view of an electronic device 4i according to some embodiments of the present disclosure. The electronic device 4i is similar to the electronic device 4h shown in FIG. 28, except that at least one external connector 48b is formed or disposed on the bonding pad of the lower circuit layer 18.

Figure 30:
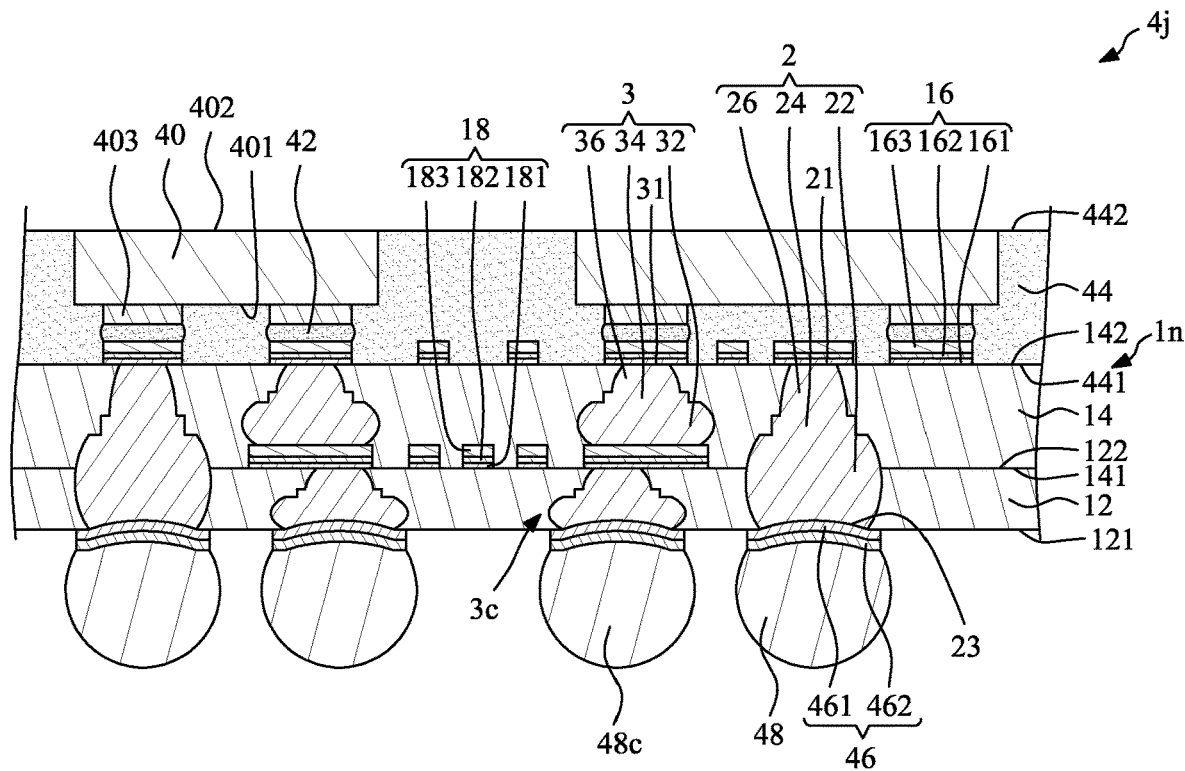
FIG. 30 illustrates a cross-sectional view of an electronic device according to some embodiments of the present disclosure.

FIG. 30 illustrates a cross-sectional view of an electronic device 4j according to some embodiments of the present disclosure. The electronic device 4j is similar to the electronic device 4a shown in FIG. 21, except for the structure of the electronic device 1n. In the electronic device In of FIG. 30, at least one second stud bump 3c is disposed in the first dielectric layer 12 to contact the lower circuit layer 18, and at least one external connector 48c is attached and electrically connected to the second stud bump 3c. Thus, the lower circuit layer 18 is electrically connected to the second stud bump 3c through the external connector 48c.

FIG. 31 through FIG. 56 illustrate a method for manufacturing an electronic device according to some embodiments of the present disclosure. In some embodiments, the method is for manufacturing an electronic device such as the electronic device 4a shown in FIG. 21.

Figure 31:
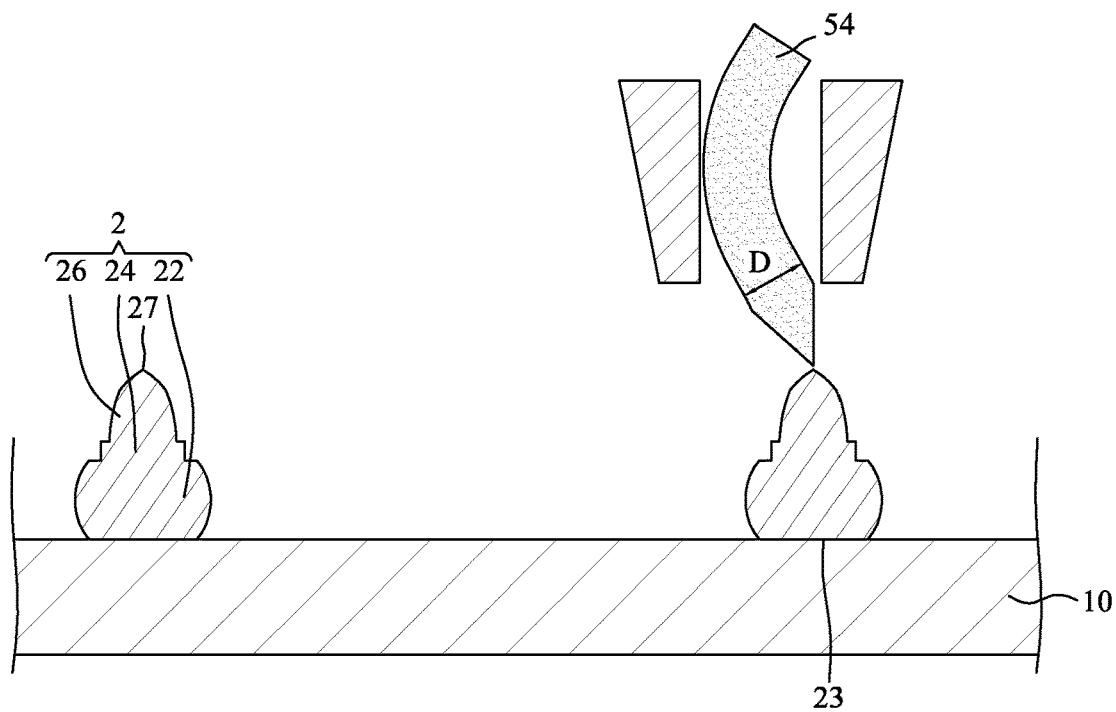
FIG. 31 illustrates one or more stages of an example of a method for manufacturing an electronic device according to some embodiments of the present disclosure.

Referring to FIG. 31, a carrier 10 is provided. The carrier 10 may be, for example, a metal material, a ceramic material, a glass material, a substrate or a semiconductor wafer. The shape of the carrier 10 may be, for example, rectangular or square. Alternatively, the shape of the carrier 10 may be, for example, circular or elliptical. In the embodiment illustrated in FIG. 31, the carrier 10 is a metal material. A thickness of the carrier 10 may be in a range of about 100 μm to about 500 μm, about 200 μm to about 800 μm, or about 500 μm to about 1500 μm.

Then, at least one first stud bump 2 may be formed or disposed on the carrier 10. In the embodiment illustrated in FIG. 31, the first stud bump 2 may be formed or disposed by a wire-bonding process. The bonding wire 54 used in the wire-bonding process has a diameter D. The first stud bump 2 may include a bump portion 22, a shoulder portion 24, a stud portion 26 and a tip portion 27. The bump portion 22, the shoulder portion 24 and the stud portion 26 are the same as the bump portion 22, the shoulder portion 24 and the stud portion 26 described in FIG. 1 and FIG. 2. In some embodiments, the maximum width $W_3$ (FIG. 2) of the stud portion 26 of the first stud bump 2 may be substantially equal to the diameter D of the bonding wire 54. The height $h_1$ (FIG. 2) of the bump portion 22 of the first stud bump 2 may be equal to about 1.2 times to 3 times the diameter D of the bonding wire 54, and the total height $h_t$ (FIG. 2) of the first stud bump 2 may be equal to about 2 times to 3 times the diameter D of the bonding wire 54. For example, the diameter D of the bonding wire 54 may be in a range of about 0.8 mils (thousandths of an inch) to about 2 mil, i.e., about 20 μm to about 50.8 μm, and the total height $h_t$ of the first stud bump 2 may be in a range of about 25 μm to about 120 μm.

The bump portion 22 is formed or disposed on the carrier 10, and the stud portion 26 is disposed on or above the bump portion 22. The shoulder portion 24 is interposed between the stud portion 26 and the bump portion 22. The tip portion 27 is disposed on or protrudes from the stud portion 26. In some embodiments, the bump portion 22, the shoulder portion 24, the stud portion 26 and the tip portion 27 are formed integrally and concurrently, thus, the first stud bump 2 is a monolithic structure without a boundary between the bump portion 22 and the shoulder portion 24, a boundary between the shoulder portion 24 and the stud portion 26 and a boundary between the stud portion 26 and the tip portion 27.

Figure 32:
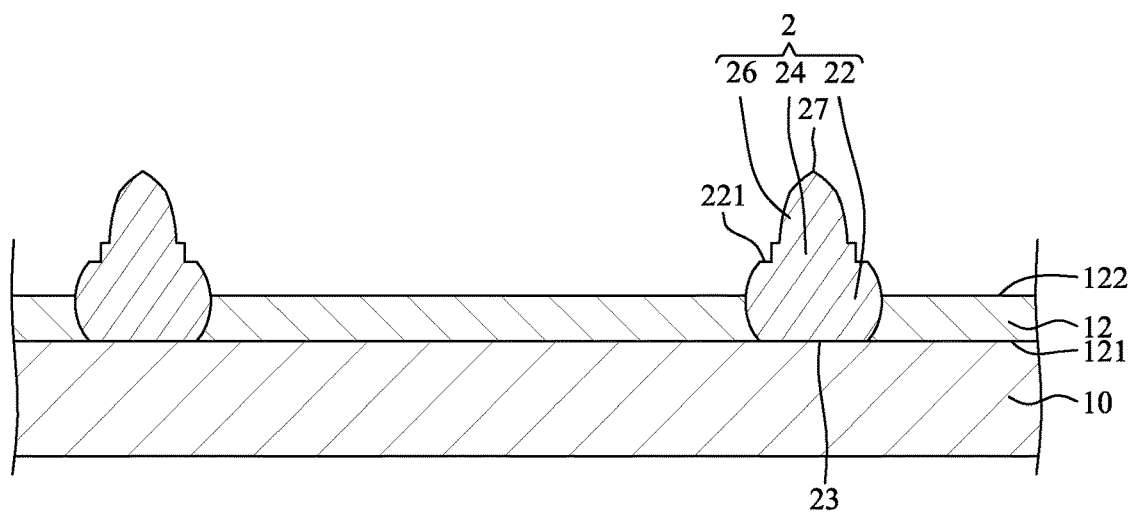
FIG. 32 illustrates one or more stages of an example of a method for manufacturing an electronic device according to some embodiments of the present disclosure.

Referring to FIG. 32, a first dielectric layer 12 is formed to cover the carrier 10 and at least a portion of the bump portion 22 of the first stud bump 2 by, for example, coating or lamination. The first dielectric layer 12 has a first surface 121 and a second surface 122 opposite to the first surface 121. The first surface 121 of the first dielectric layer 12 contacts the carrier 10, and the second surface 122 of the first dielectric layer 12 is lower than the top surface 221 of the bump portion 22. Since the first dielectric layer 12 may be formed after the formation of the first stud bump 2, thus, a surface condition (e.g., surface roughness) of a boundary between the first dielectric layer 12 and the bump portion 22 of the first stud bump 2 is determined by the surface condition (e.g., surface roughness) of the sidewall of the bump portion 22 of the first stud bump 2. As a result, the surface condition (e.g., surface roughness) of the boundary between the first dielectric layer 12 and the bump portion 22 of the first stud bump 2 may be smoother than the surface condition (e.g., surface roughness) of the sidewall of the through hole of the dielectric layer of the comparative semiconductor substrate. Then, the first dielectric layer 12 is cured.

Figure 33:
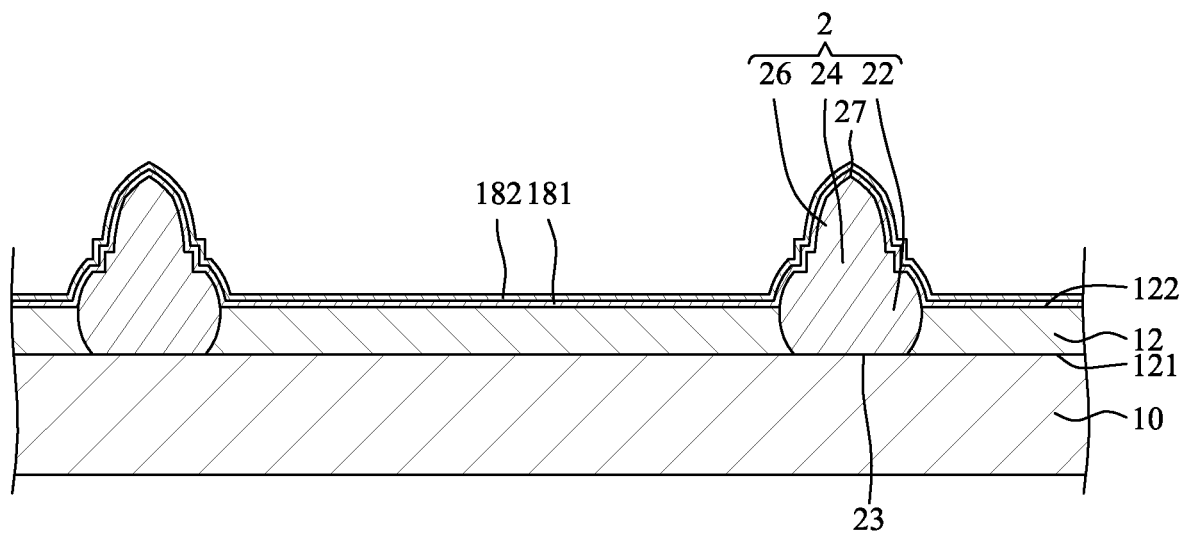
FIG. 33 illustrates one or more stages of an example of a method for manufacturing an electronic device according to some embodiments of the present disclosure.

Referring to FIGS. 33 to 38, the lower circuit layer 18 of FIG. 1 is formed. Referring to FIG. 33, a first metal layer 181 is formed or disposed on the second surface 122 of the first dielectric layer 12 to cover the first dielectric layer 12 and the exposed portion of the first stud bump 2, and a second metal layer 182 is formed or disposed on the first metal layer 181. The first metal layer 181 and the second metal layer 182 may be seed layers including, for example, titanium and/or copper, another metal, or an alloy, and may be formed or disposed by sputtering. For example, the first metal layer 181 may include titanium, and the second metal layer 182 may include copper.

Figure 34:
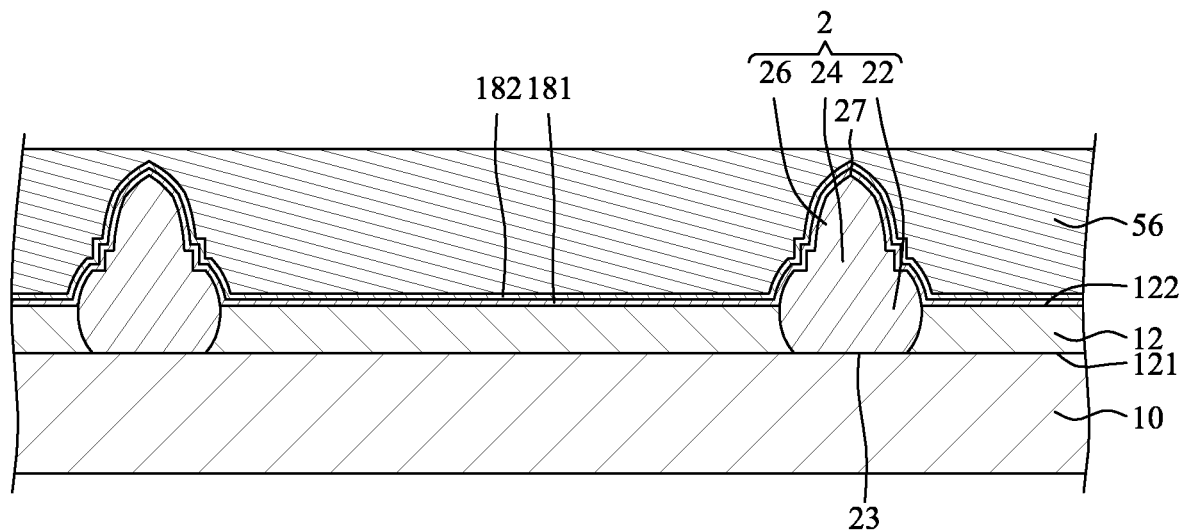
FIG. 34 illustrates one or more stages of an example of a method for manufacturing an electronic device according to some embodiments of the present disclosure.

Referring to FIG. 34, a photoresist layer 56 is formed on the second metal layer 182 by, for example, coating or lamination.

Figure 35:
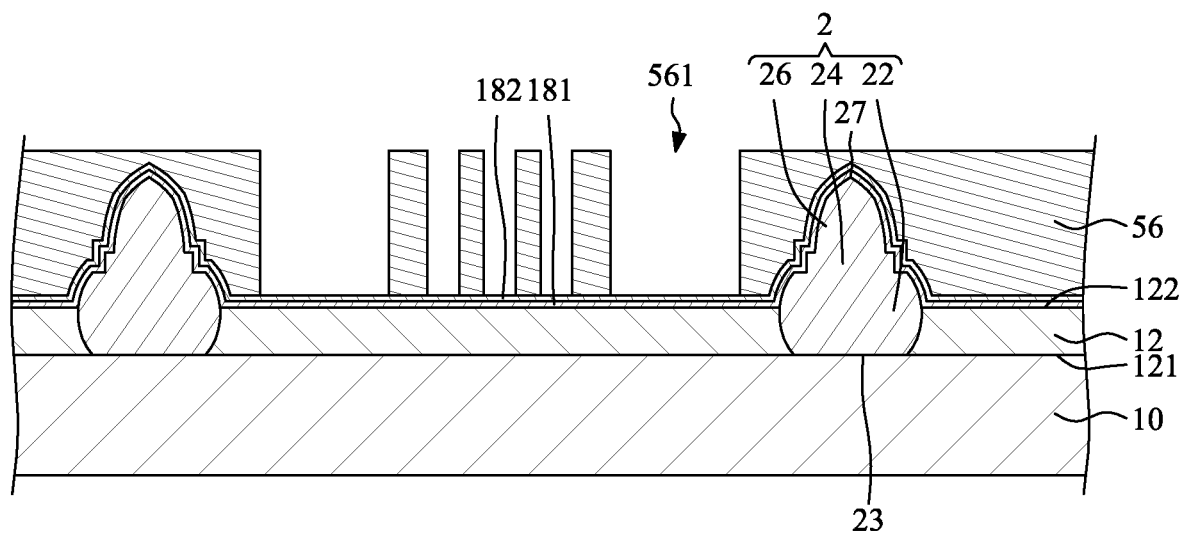
FIG. 35 illustrates one or more stages of an example of a method for manufacturing an electronic device according to some embodiments of the present disclosure.

Referring to FIG. 35, a plurality of openings 561 are formed in the photoresist layer 56 by, for example, a photolithography process (e.g., including exposure and development) to expose portions of the second metal layer 182. It is noted that the positions of the openings 561 do not correspond to the position of the first stud bump 2.

Figure 36:
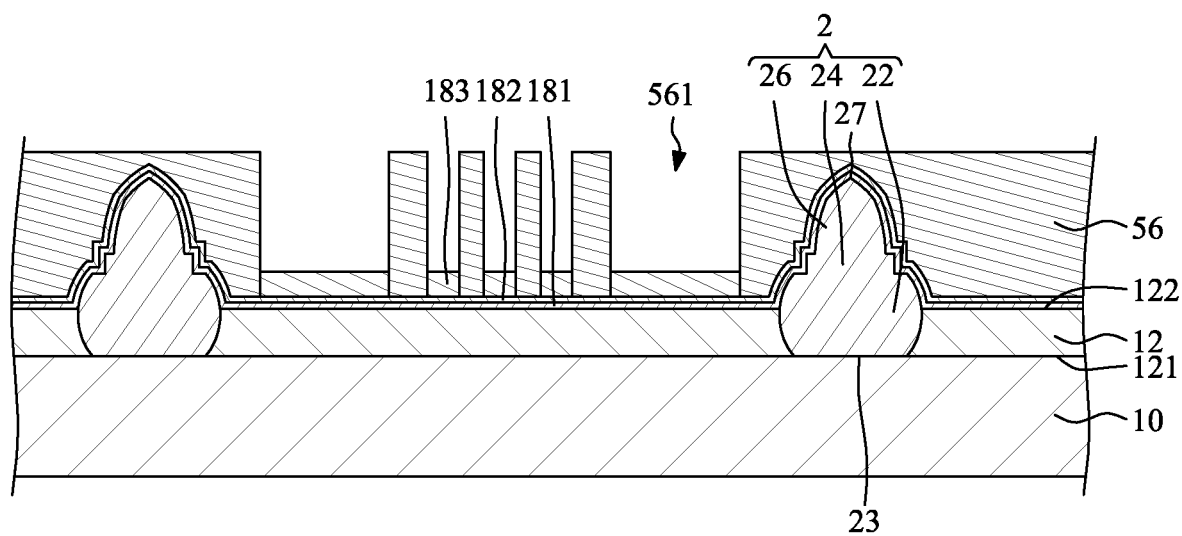
FIG. 36 illustrates one or more stages of an example of a method for manufacturing an electronic device according to some embodiments of the present disclosure.

Referring to FIG. 36, a third metal layer 183 may be formed or disposed on the second metal layer 182 in the openings 561 of the photoresist layer 56 by, for example, electroplating.

Figure 37:
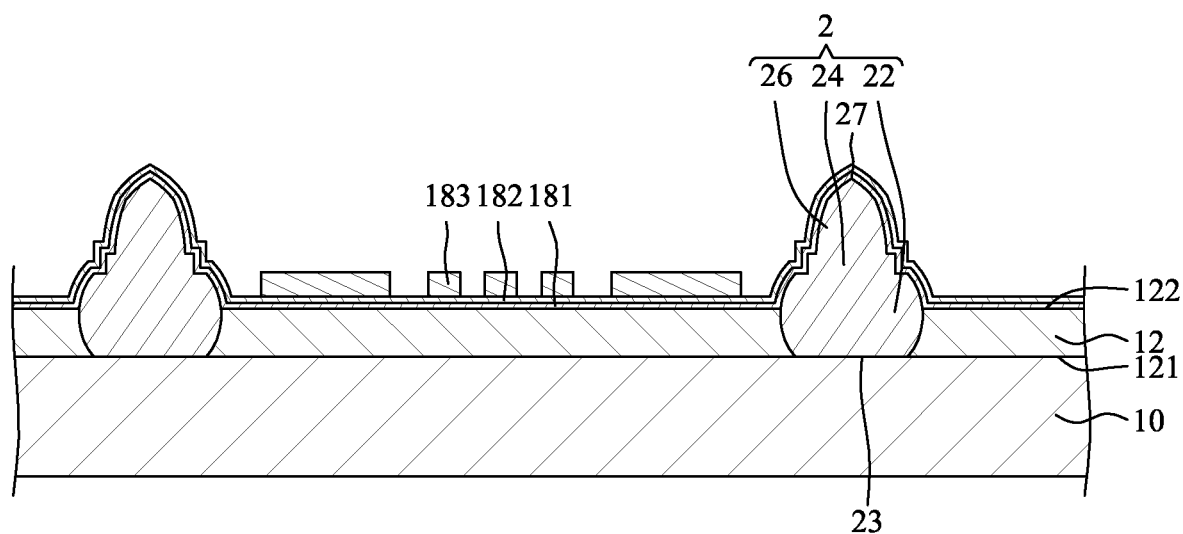
FIG. 37 illustrates one or more stages of an example of a method for manufacturing an electronic device according to some embodiments of the present disclosure.

Referring to FIG. 37, the photoresist layer 56 is removed by, for example, stripping.

Figure 38:
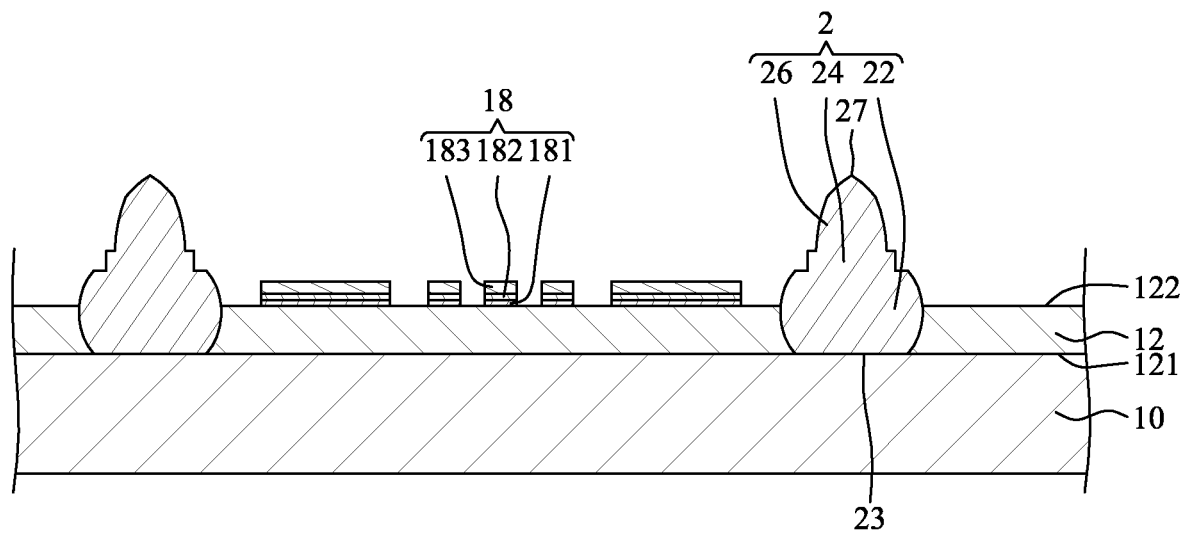
FIG. 38 illustrates one or more stages of an example of a method for manufacturing an electronic device according to some embodiments of the present disclosure.

Referring to FIG. 38, the portions of the first metal layer 181 and the second metal layer 182 that are not covered by the third metal layer 183 are removed by, for example, etching. Meanwhile, the lower circuit layer 18 is formed. Thus, the lower circuit layer 18 may include a first metal layer 181, a second metal layer 182 and a third metal layer 183. The lower circuit layer 18 may not contact the bump portion 22 of the first stud bump 2.

Figure 39:
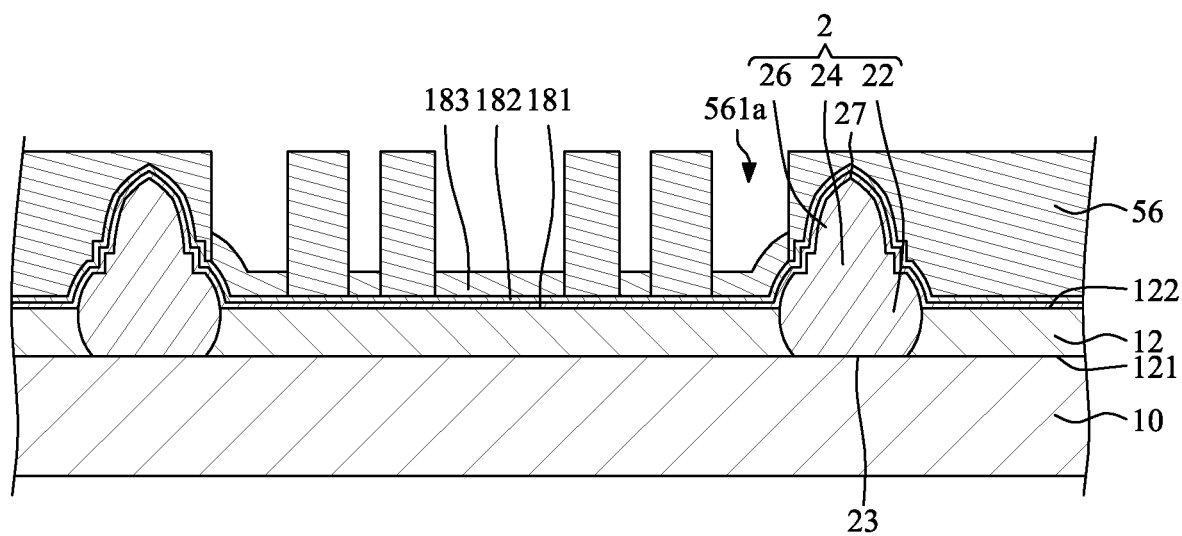
FIG. 39 illustrates one or more stages of an example of a method for manufacturing an electronic device according to some embodiments of the present disclosure.
Figure 40:
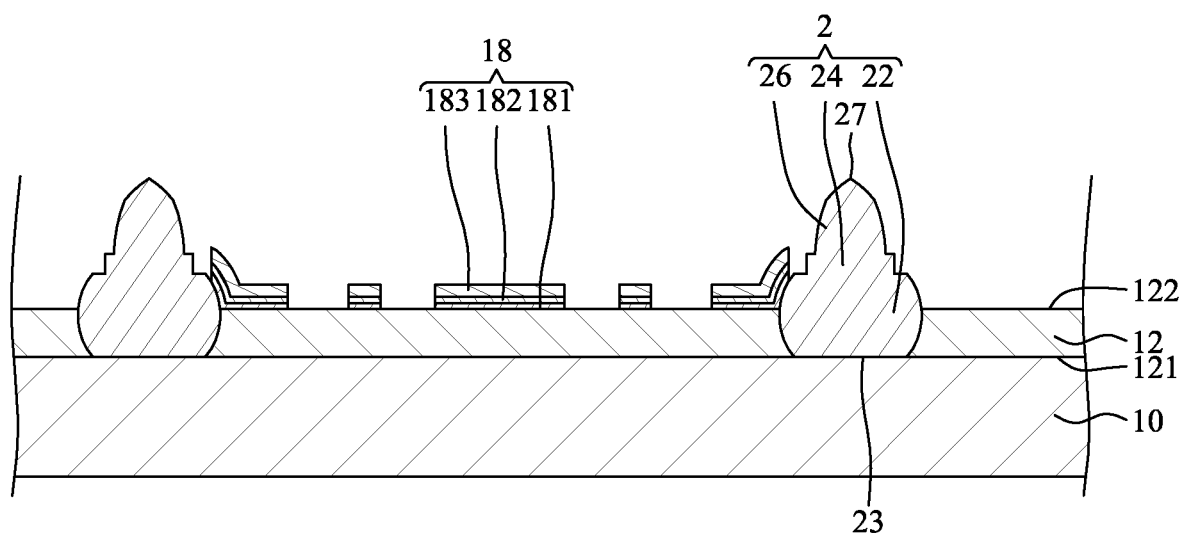
FIG. 40 illustrates one or more stages of an example of a method for manufacturing an electronic device according to some embodiments of the present disclosure.

Referring to FIGS. 39 to 40, the lower circuit layer 18 of FIG. 5 is formed. Referring to FIG. 39, which is subsequent to FIG. 34, a plurality of openings 561a are formed in the photoresist layer 56 by, for example, a photolithography process (e.g., including exposure and development) to expose portions of the second metal layer 182. It is noted that the positions of the openings 561a correspond to the position of the first stud bump 2. As shown in FIG. 39, the openings 561a of the photoresist layer 56 may extend to a position above the bump portion 22 of the first stud bump 2. Then, a third metal layer 183 may be formed or disposed on the second metal layer 182 in the openings 561a of the photoresist layer 56 by, for example, electroplating.

Referring to FIG. 40, the photoresist layer 56 is removed by, for example, stripping. Then, the portions of the first metal layer 181 and the second metal layer 182 that are not covered by the third metal layer 183 are removed by, for example, etching. Meanwhile, the lower circuit layer 18 is formed. The lower circuit layer 18 may contact the bump portion 22 of the first stud bump 2.

Referring to FIG. 41, at least one second stud bump 3 may be formed or disposed on the bonding pad of the lower circuit layer 18. In the embodiment illustrated in FIG. 41, the shape of the second stud bump 3 is similar to the shape of the first stud bump 2, and a height of the second stud bump 3 is smaller than a height of the first stud bump 2. That is, the second stud bump 3 can be treated as a compressed first stud bump 2. The second stud bump 3 may be formed or disposed by a wire-bonding process. The second stud bump 3 may include a bump portion 32, a shoulder portion 34, a stud portion 36 and a tip portion 37. The bump portion 32 is formed or disposed on the bonding pad of the lower circuit layer 18, and the stud portion 36 is disposed on or above the bump portion 32. The shoulder portion 34 is interposed between the stud portion 36 and the bump portion 32. The tip portion 37 is disposed on or protrudes from the stud portion 36. In some embodiments, the bump portion 32, the shoulder portion 34, the stud portion 36 and a tip portion 37 are formed integrally and concurrently, thus, the second stud bump 3 is a monolithic structure without a boundary between the bump portion 32 and the shoulder portion 34, a boundary between the shoulder portion 34 and the stud portion 36, and a boundary between the stud portion 36 and the tip portion 37.

In some embodiments, the maximum width of the stud portion 36 of the second stud bump 3 may be substantially equal to the diameter D of the bonding wire 54 used in the wire-bonding process. The height of the bump portion 32 of the second stud bump 3 may be equal to about 1.2 times to 3 times the diameter D of the bonding wire 54, and the total height of the second stud bump 3 may be equal to about 2 times to 3 times the diameter D of the bonding wire 54. For example, the diameter D of the bonding wire 54 may be in a range of about 0.8 mils (thousandths of an inch) to about 2 mil, i.e., about 20 μm to about 50.8 μm, and the total height of the second stud bump 3 may be in a range of about 25 μm to about 120 μm.

Figure 42:
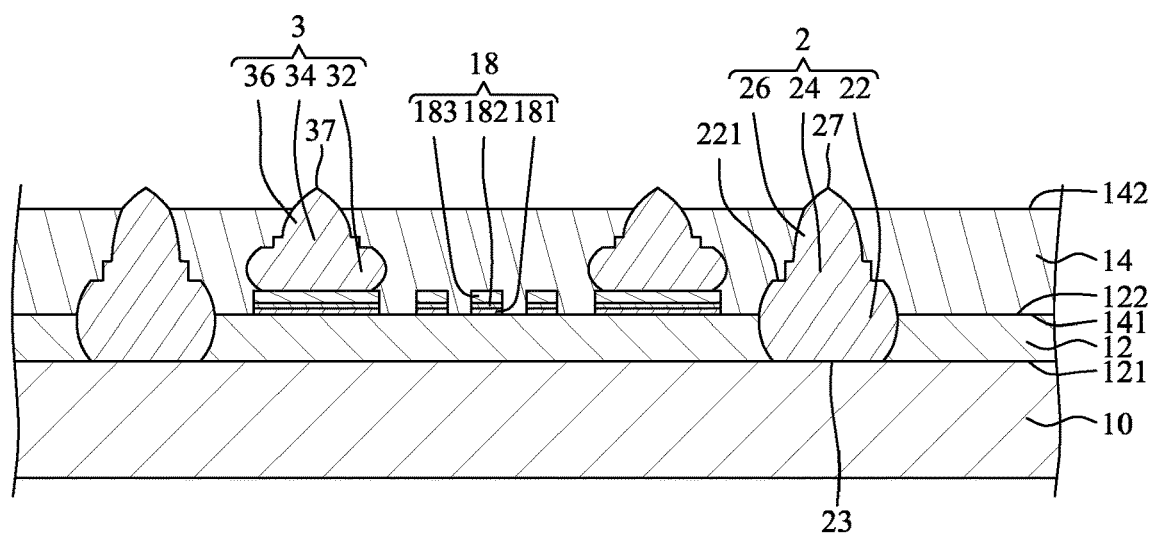
FIG. 42 illustrates one or more stages of an example of a method for manufacturing an electronic device according to some embodiments of the present disclosure.

Referring to FIG. 42, a second dielectric layer 14 may be formed or disposed on the first dielectric layer 12 to cover the first dielectric layer 12, the lower circuit layer 18, at least a portion of the stud portion 26 of the first stud bump 2 and the second stud bump 3 by, for example, coating or lamination. The second dielectric layer 14 has a first surface 141 and a second surface 142 opposite to the first surface 141. The first surface 141 of the second dielectric layer 14 contacts the second surface 122 of the first dielectric layer 12, thus, the first surface 141 of the second dielectric layer 14 or the second surface 122 of the first dielectric layer 12 is the boundary between the second dielectric layer 14 and the first dielectric layer 12. As shown in FIG. 42, the boundary (e.g., the first surface 141 of the second dielectric layer 14 or the second surface 122 of the first dielectric layer 12) between the second dielectric layer 14 and the first dielectric layer 12 is lower than the top surface 221 of the bump portion 22 of the first stud bump 2. Thus, the second dielectric layer 14 covers the stud portion 26 and the shoulder portion 24 of the first stud bump 2 and the upper portion of the bump portion 22 of the first stud bump 2. In addition, the tip portion 27 of the first stud bump 2 and the tip portion 37 of the second stud bump 3 may protrude from the second surface 142 of the second dielectric layer 14. Then, the second dielectric layer 14 is cured.

Figure 43:
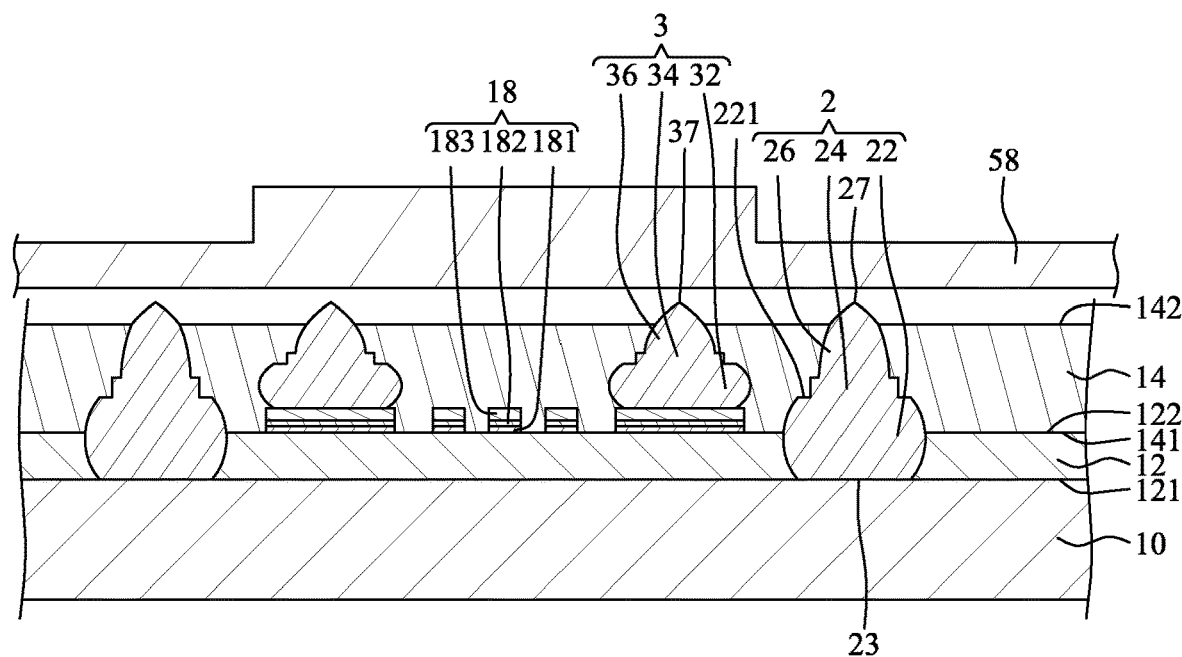
FIG. 43 illustrates one or more stages of an example of a method for manufacturing an electronic device according to some embodiments of the present disclosure.
Figure 44:
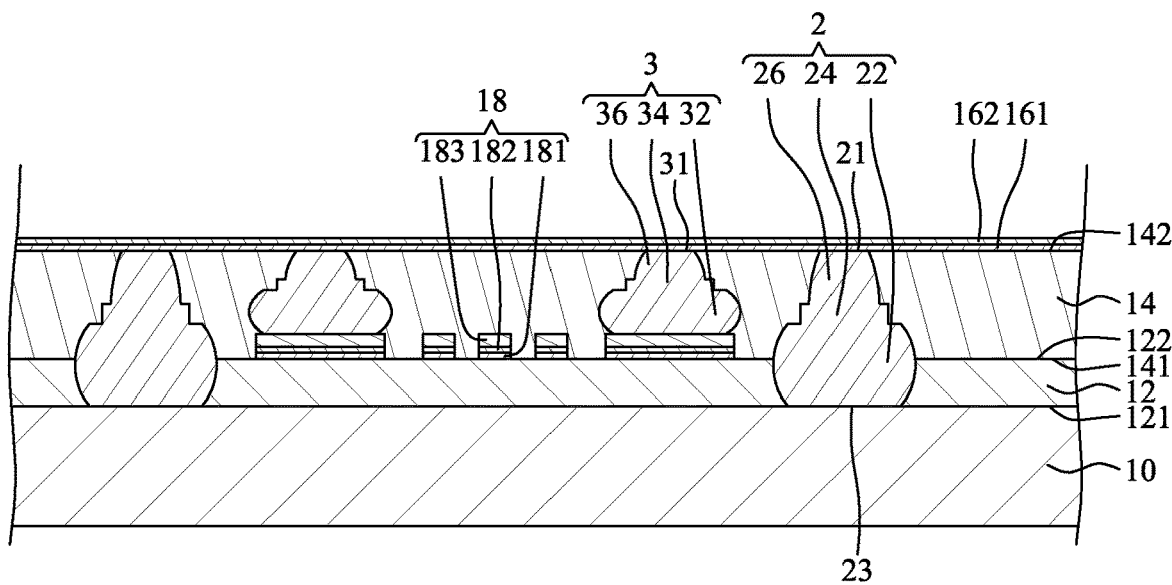
FIG. 44 illustrates one or more stages of an example of a method for manufacturing an electronic device according to some embodiments of the present disclosure.

Referring to FIG. 43, a compress head 58 is applied to the second surface 142 of the second dielectric layer 14 to compress and eliminate the tip portion 27 of the first stud bump 2 and the tip portion 37 of the second stud bump 3. That is, the tip portion 27 of the first stud bump 2 is compressed into the stud portion 26 to form a flat top surface 21 (FIG. 44), and the tip portion 37 of the second stud bump 3 is compressed into the stud portion 36 to form a flat top surface 31 (FIG. 44). Thus, the second surface 142 of the second dielectric layer 14 is substantially coplanar with the top surface 21 of the first stud bump 2 and the top surface 31 of the second stud bump 3. In some embodiments, the tip portion 27 of the first stud bump 2 and the tip portion 37 of the second stud bump 3 may be removed by grinding.

Referring to FIG. 44, a first metal layer 161 and a second metal layer 162 are formed or disposed in that order on the second dielectric layer 14. The first metal layer 161 and the second metal layer 162 may be seed layers including, for example, titanium and/or copper, another metal, or an alloy, and may be formed or disposed by sputtering. For example, the first metal layer 161 may include titanium, and the second metal layer 162 may include copper. In some embodiments, as shown in FIG. 44, portions of the first metal layer 161 may cover and contact the top surface 21 of the first stud bump 2 and the top surface 31 of the second stud bump 3. In one or more embodiments, the line width/line space (L/S) of the lower circuit layer 18 is greater than the line width/line space (L/S) of the upper circuit layer 16.

Figure 45:
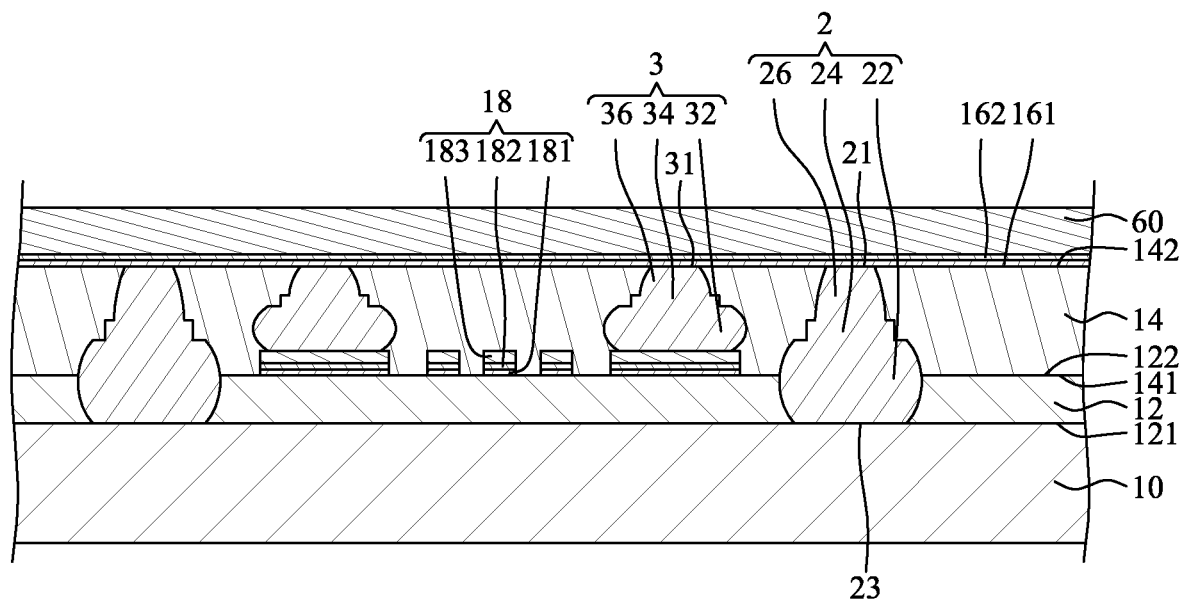
FIG. 45 illustrates one or more stages of an example of a method for manufacturing an electronic device according to some embodiments of the present disclosure.

Referring to FIG. 45, a photoresist layer 60 is formed on the second metal layer 162 by, for example, coating or lamination.

Figure 46:
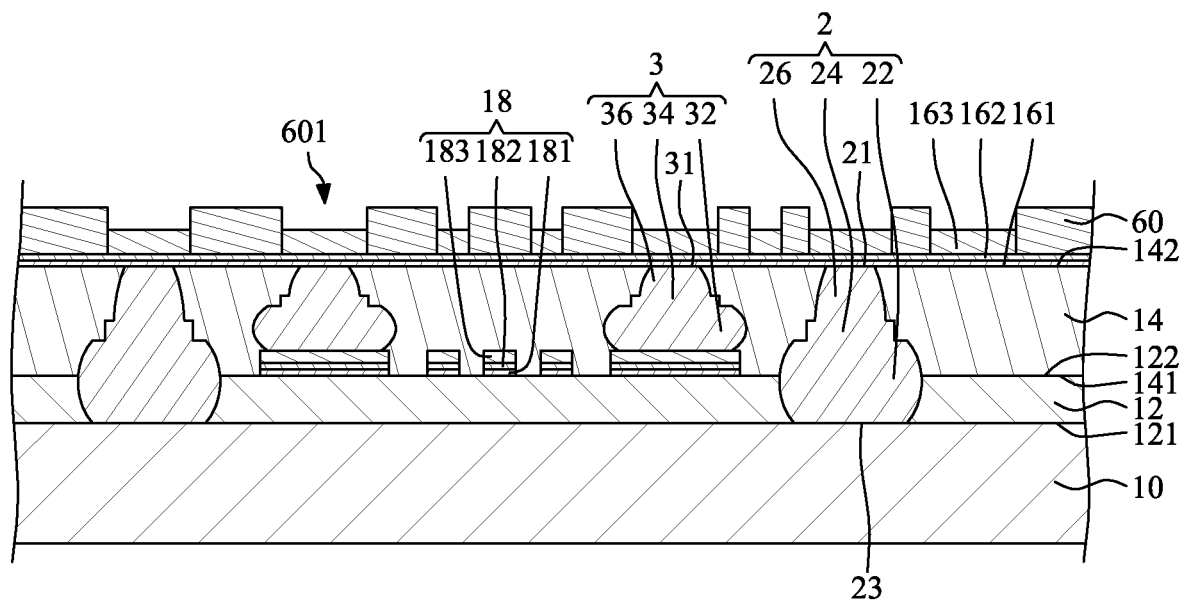
FIG. 46 illustrates one or more stages of an example of a method for manufacturing an electronic device according to some embodiments of the present disclosure.

Referring to FIG. 46, a plurality of openings 601 are formed in the photoresist layer 60 by, for example, a photolithography process (e.g., including exposure and development) to expose portions of the second metal layer 162. Then, a third metal layer 163 may be formed or disposed on the second metal layer 162 in the openings 601 of the photoresist layer 60 by, for example, electroplating.

Figure 47:
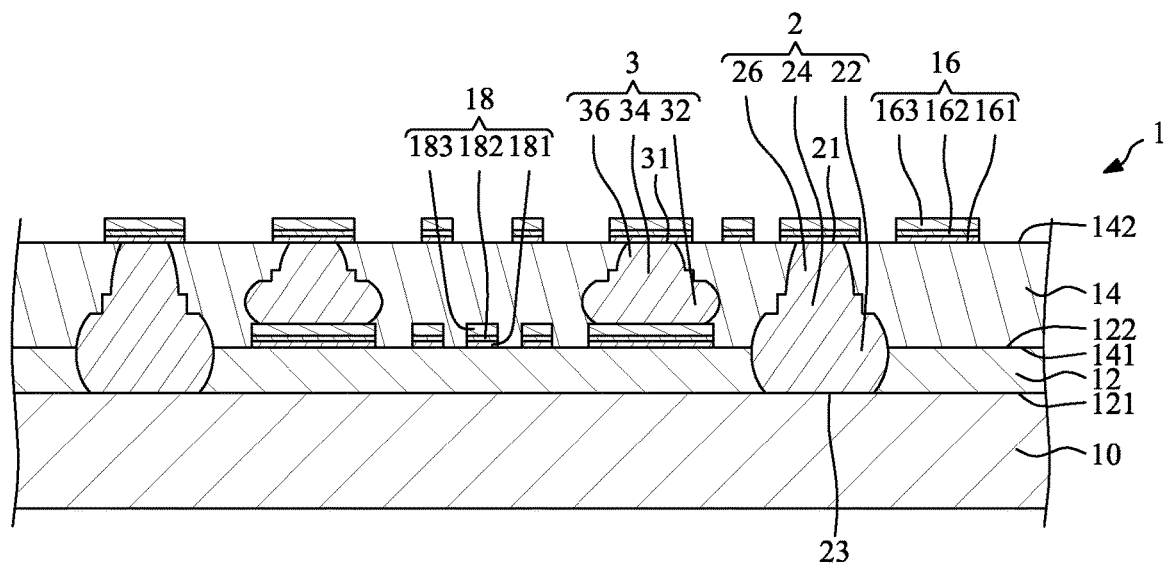
FIG. 47 illustrates one or more stages of an example of a method for manufacturing an electronic device according to some embodiments of the present disclosure.

Referring to FIG. 47, the photoresist layer 60 is removed by, for example, stripping. Then, the portions of the first metal layer 161 and the second metal layer 162 that are not covered by the third metal layer 163 are removed by, for example, etching. Meanwhile, the upper circuit layer 16 is formed. Thus, the upper circuit layer 16 may include a first metal layer 161, a second metal layer 162 and a third metal layer 163. Thus, a portion of the upper circuit layer 16 may cover and contact the stud portion 36 of the second stud bump 3, and two ends of the second stud bump 3 may contact the lower circuit layer 18 and the upper circuit layer 16 respectively. The upper circuit layer 16 may be electrically connected to the lower circuit layer 18 through the second stud bump 3. In addition, another portion of the upper circuit layer 16 may cover and contact the stud portion 26 of the first stud bump 2. In addition, it is noted that the electronic device 1 of FIG. 1 and FIG. 2 is obtained at this stage.

Figure 48:
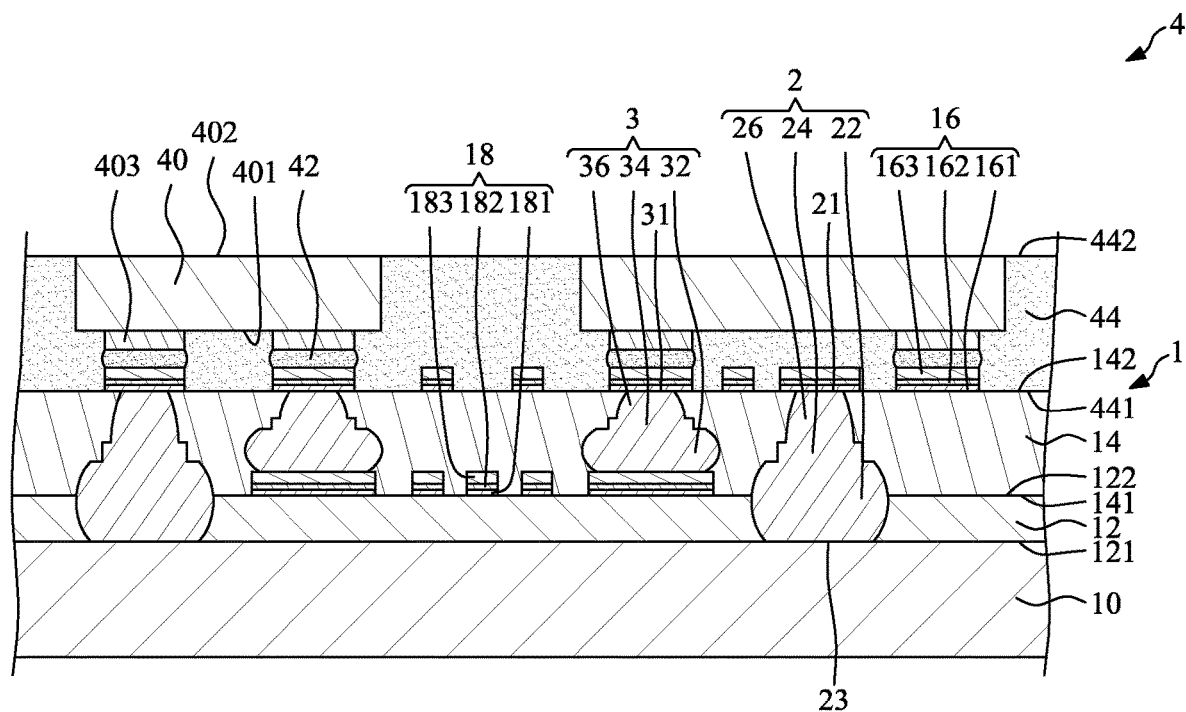
FIG. 48 illustrates one or more stages of an example of a method for manufacturing an electronic device according to some embodiments of the present disclosure.

Referring to FIG. 48, at least one electronic component 40 is disposed on the electronic device 1. In some embodiments, the electronic component 40 is disposed adjacent to the second surface 142 of the second dielectric layer 14 and is electrically connected to the upper circuit layer 16. For example, the electronic component 40 may be a semiconductor die. The electronic component 40 has a first surface 401 (e.g., an active surface) and a second surface 402 (e.g., a backside surface) opposite to the first surface 401. Further, the electronic component 40 includes, or is electrically connected to, at least one conductive pillar 403 and at least one solder bump 42 sequentially disposed on the first surface 401 of the electronic component 40. The solder bump 42 is electrically connected to the bonding pads of the upper circuit layer 16. Thus, the electronic component 40 is attached to the electronic device 1 by flip-chip bonding.

Then, an encapsulant 44, such as a molding compound, is formed or disposed on the second surface 142 of the second dielectric layer 14 and covers the electronic component 40, the conductive pillar 403, the solder bump 42 and the upper circuit layer 16. The encapsulant 44 has a first surface 441 and a second surface 442 opposite to the first surface 441. The second surface 442 of the encapsulant 44 may be substantially coplanar with the second surface 402 of the electronic component 40. Thus, the second surface 402 of the electronic component 40 may be exposed from the second surface 442 of the encapsulant 44. It is noted that the electronic device 4 of FIG. 20 is obtained at this stage.

Figure 49:
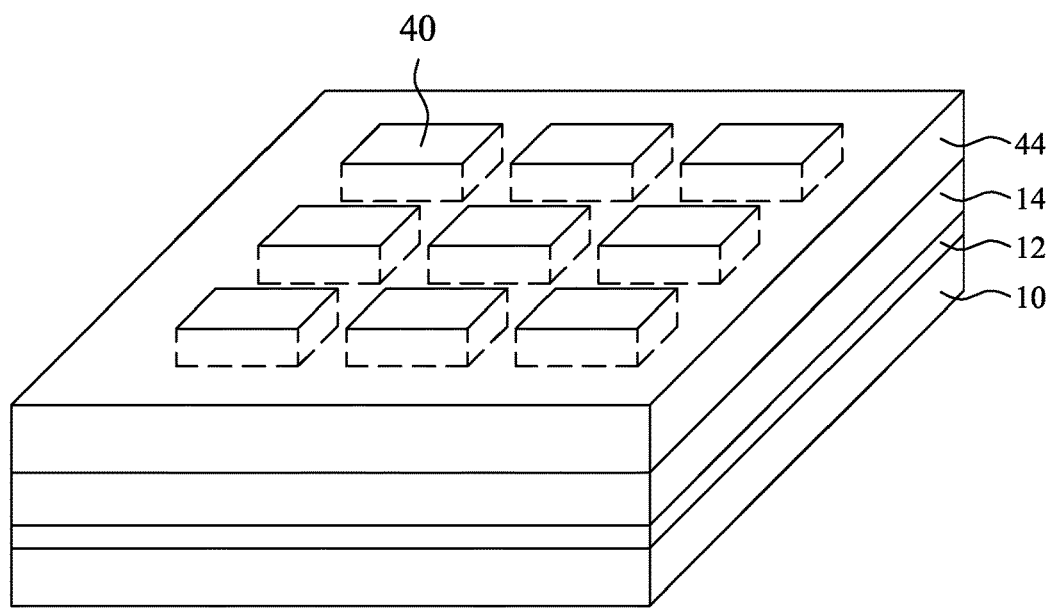
FIG. 49 illustrates one or more stages of an example of a method for manufacturing an electronic device according to some embodiments of the present disclosure.

Referring to FIG. 49, the shape of the electronic device 1 (including the carrier 10) may be substantially rectangular or square.

Figure 50:
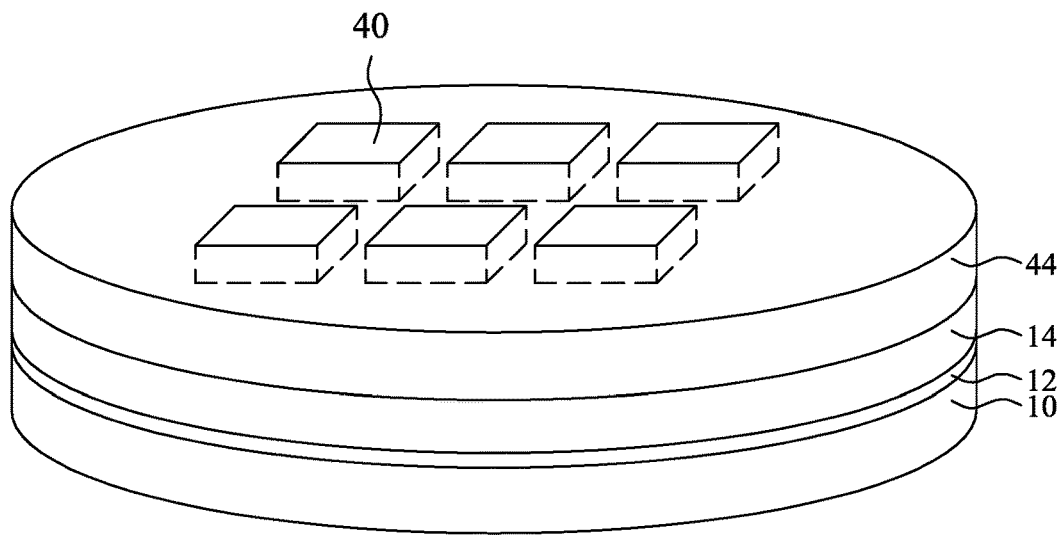
FIG. 50 illustrates one or more stages of an example of a method for manufacturing an electronic device according to some embodiments of the present disclosure.

Referring to FIG. 50, the shape of the electronic device 1 (including the carrier 10) may be substantially circular or elliptical.

Figure 51:
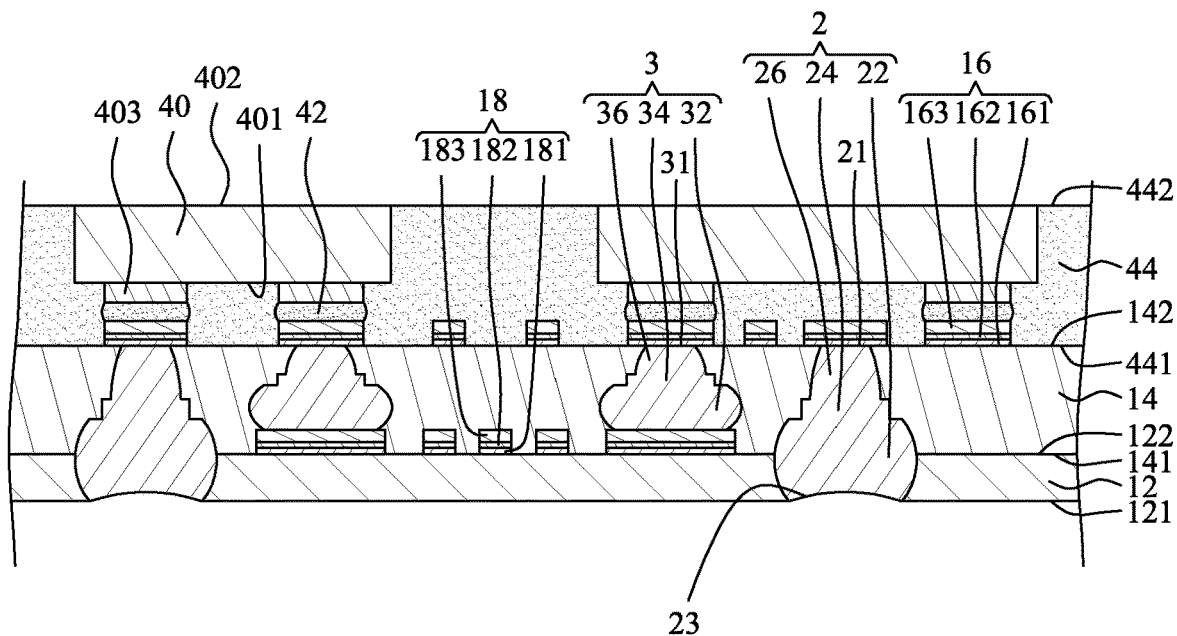
FIG. 51 illustrates one or more stages of an example of a method for manufacturing an electronic device according to some embodiments of the present disclosure.

Referring to FIG. 51, the carrier 10 is removed by, for example, stripping or coarse etching. Then, a chemical fine etching is conducted to the bottom surface 23 of the bump portion 22 of the first stud bump 2. Thus, the bottom surface 23 of the bump portion 22 of the first stud bump 2 is recessed from the first surface 121 of the first dielectric layer 12. In some embodiments, the carrier 10 is thinned and patterned to form a bottom circuit layer 20 (FIG. 7) so as to obtain the electronic device 1e of FIG. 7.

Figure 52:
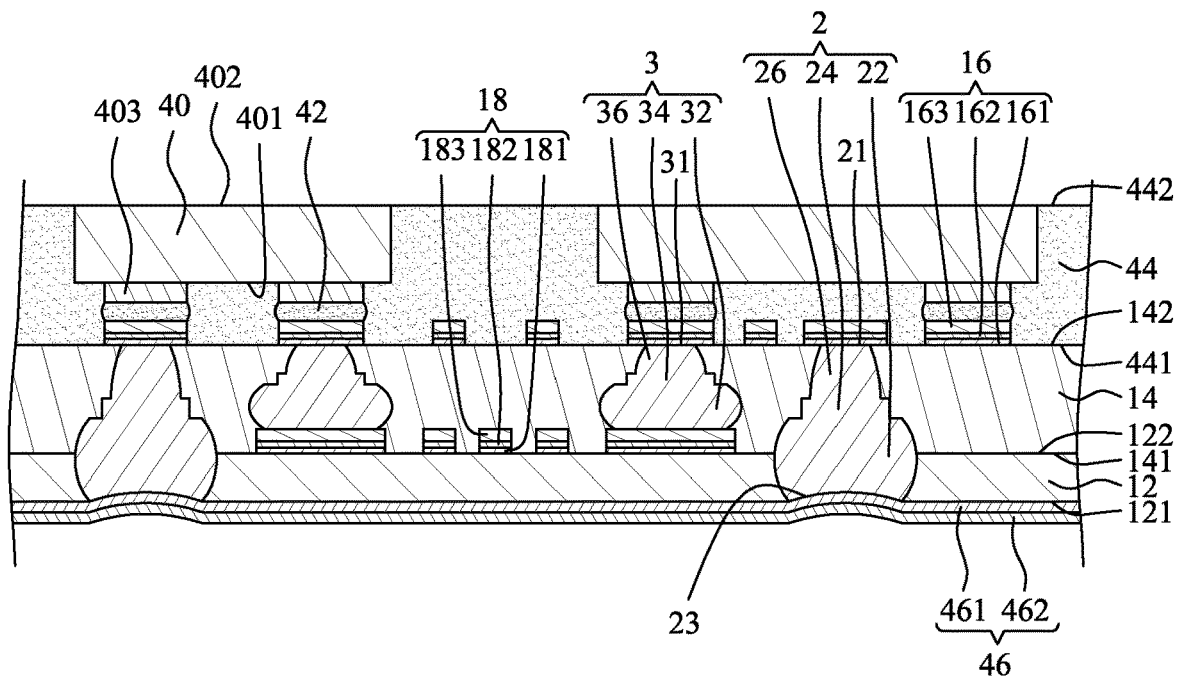
FIG. 52 illustrates one or more stages of an example of a method for manufacturing an electronic device according to some embodiments of the present disclosure.

Referring to FIG. 52, a seed layer 46 is formed or disposed on the bottom surface 23 of the bump portion 22 of the first stud bump 2 and the first surface 121 of the first dielectric layer 12. For example, the seed layer 46 may include a first metal layer 461 and a second metal layer 462 disposed in that order on the bump portion 22 of the first stud bump 2. For example, the first metal layer 461 may include titanium, and the second metal layer 462 may include copper, and may be formed or disposed by sputtering.

Figure 53:
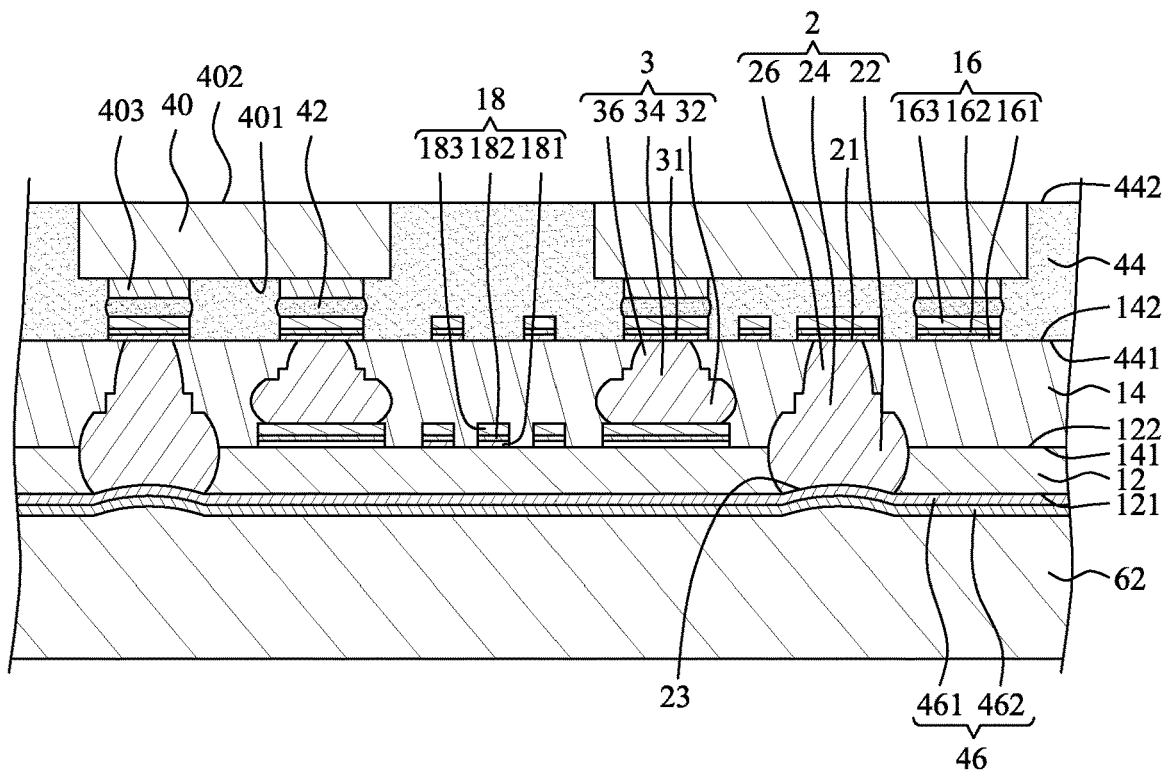
FIG. 53 illustrates one or more stages of an example of a method for manufacturing an electronic device according to some embodiments of the present disclosure.

Referring to FIG. 53, a photoresist layer 62 is formed on the second metal layer 462 of the seed layer 46 by, for example, coating or lamination.

Figure 54:
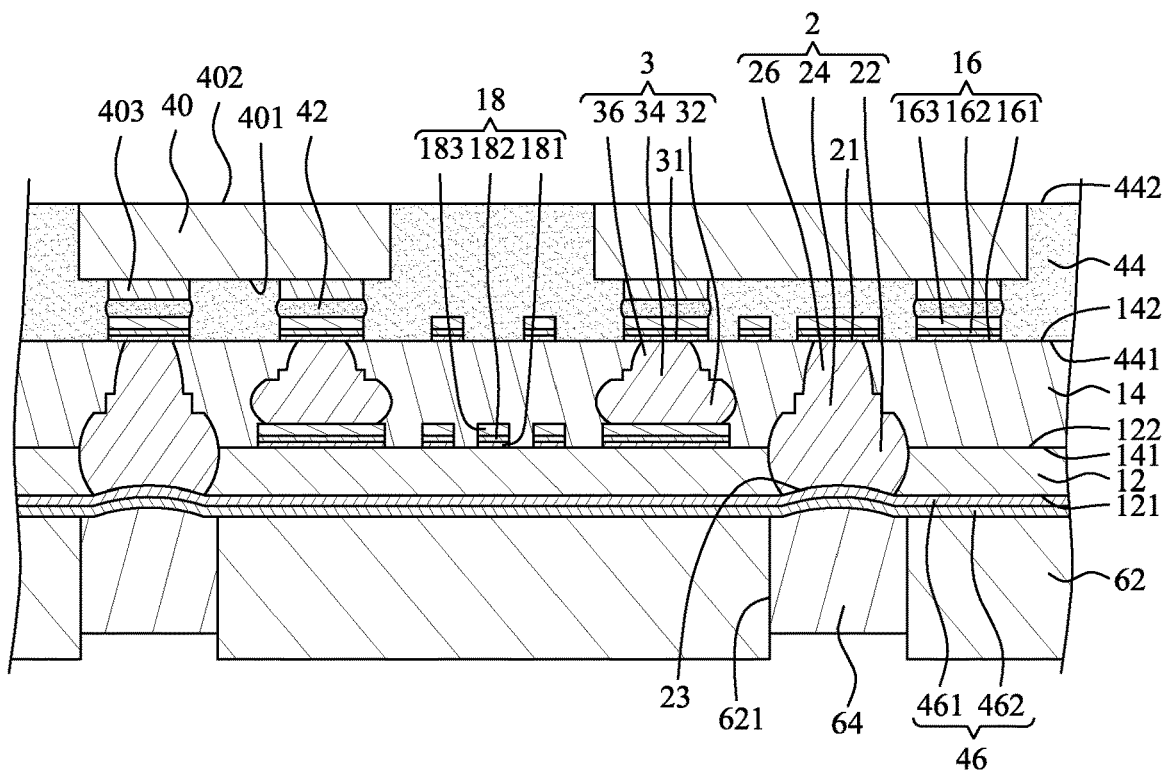
FIG. 54 illustrates one or more stages of an example of a method for manufacturing an electronic device according to some embodiments of the present disclosure.

Referring to FIG. 54, a plurality of openings 621 are formed in the photoresist layer 62 by, for example, a photolithography process (e.g., including exposure and development) to expose portions of the second metal layer 462. Then, a solder material 64 may be formed or disposed on the second metal layer 462 in the openings 621 of the photoresist layer 62 by, for example, electroplating. A material of the solder material 64 may be a conductive metal, such as, for example, tin and/or silver, or another metal or combination of metals.

Figure 55:
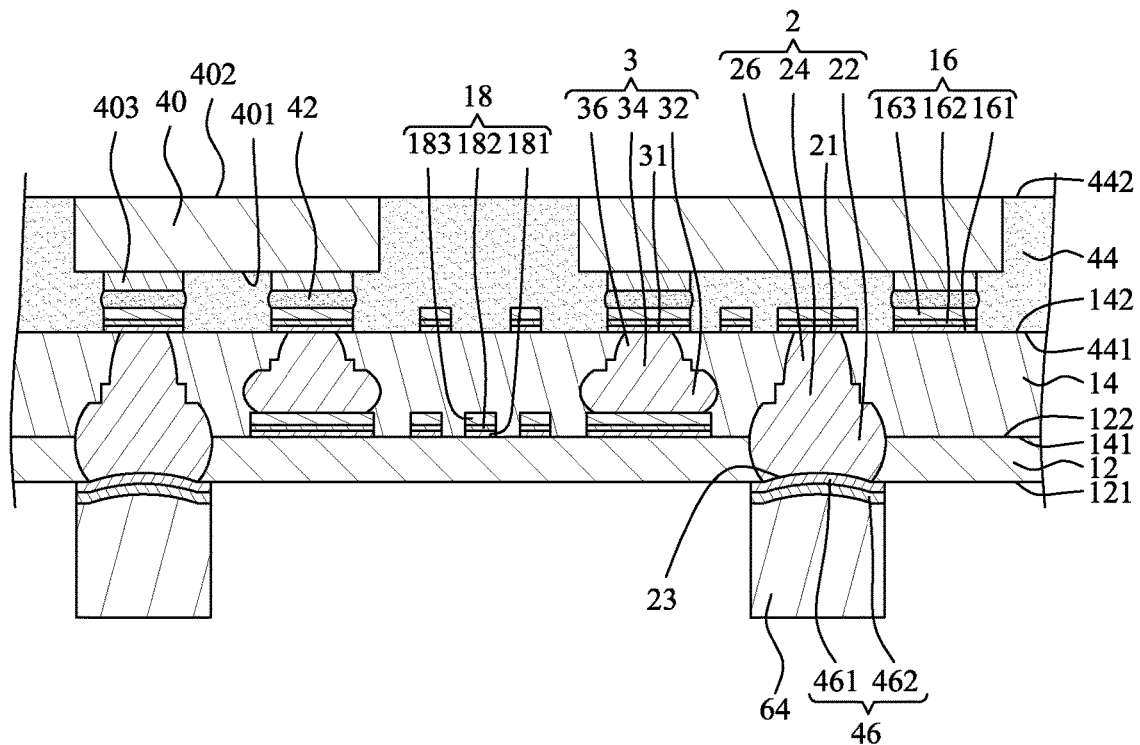
FIG. 55 illustrates one or more stages of an example of a method for manufacturing an electronic device according to some embodiments of the present disclosure.

Referring to FIG. 55, the photoresist layer 62 is removed by, for example, stripping. Then, the portions of the first metal layer 461 and the second metal layer 462 that are not covered by the solder material 64 are removed by, for example, etching. Meanwhile, the patterned seed layer 46 is formed.

Figure 56:
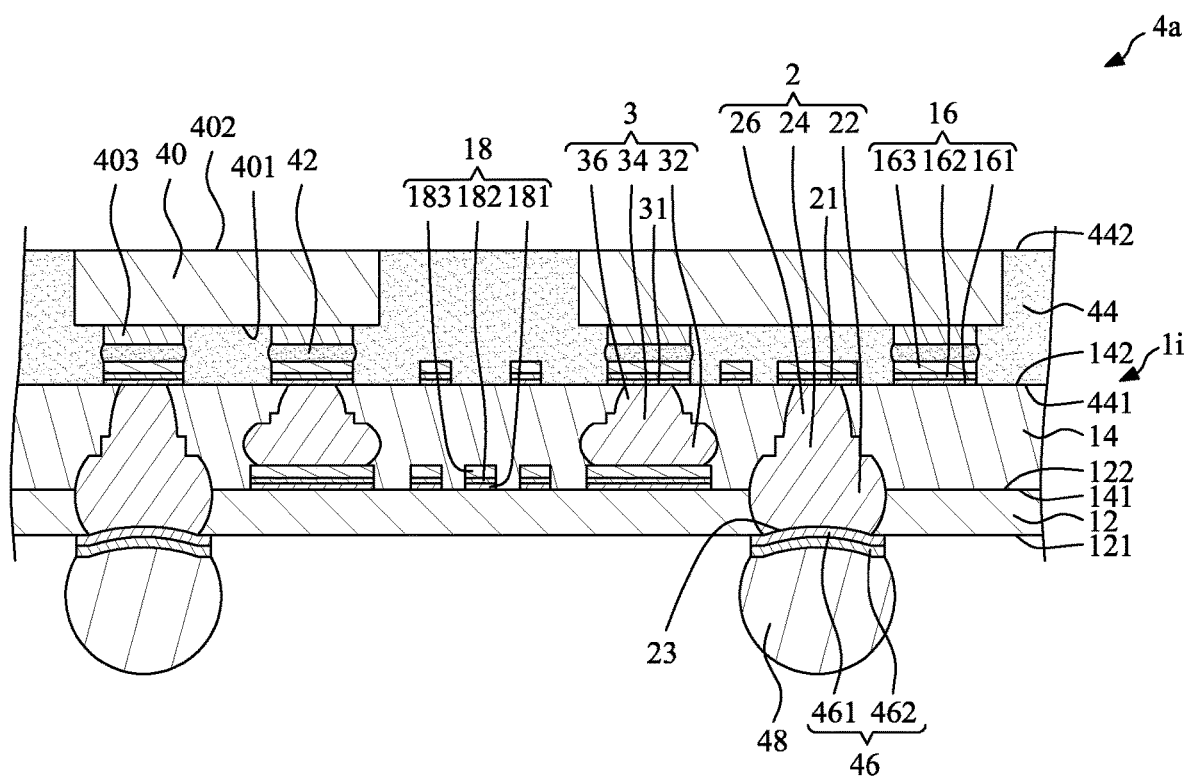
FIG. 56 illustrates one or more stages of an example of a method for manufacturing an electronic device according to some embodiments of the present disclosure.

Referring to FIG. 56, a reflow process is conducted so that the solder material 64 becomes an external connector 48 that is in a substantially ball shape. Meanwhile, the electronic device 4a of FIG. 21 is obtained. In addition, a singulation process may be conducted to form a plurality of electronic devices or semiconductor packages.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a first dielectric layer;
a second dielectric layer disposed on the first dielectric layer;
at least one first stud bump disposed in the first dielectric layer and the second dielectric layer, wherein the first stud bump includes a bump portion and a stud portion, and the stud portion is disposed on the bump portion;
an upper circuit layer disposed on the second dielectric layer, wherein the upper circuit layer contacts the stud portion of the first stud bump; and
a lower circuit layer disposed on the first dielectric layer, wherein a line width/line space (L/S) of the lower circuit layer is greater than a line width/line space (L/S) of the upper circuit layer.

2. The electronic device of claim 1, wherein a volume of the bump portion of the first stud bump is greater than a volume of the stud portion of the first stud bump.

3. The electronic device of claim 1, wherein the stud portion of the first stud bump is in a cone shape, and the bump portion of the first stud bump is in a disk shape.

4. The electronic device of claim 1, wherein the first stud bump further includes a shoulder portion interposed between the stud portion of the first stud bump and the bump portion of the first stud bump, a maximum width of the bump portion of the first stud bump is greater than a maximum width of the shoulder portion of the first stud bump, and the maximum width of the shoulder portion of the first stud bump is greater than a maximum width of the stud portion of the first stud bump.

5. The electronic device of claim 1, wherein a maximum width of the bump portion of the first stud bump is greater than a maximum width of the stud portion of the first stud bump.

6. The electronic device of claim 1, wherein the stud portion of the first stud bump and the bump portion of the first stud bump are formed integrally.

7. The electronic device of claim 1, wherein a sidewall of the bump portion of the first stud bump is convex.

8. The electronic device of claim 1, wherein a boundary between the first dielectric layer and the second dielectric layer is lower than a top surface of the bump portion of the first stud bump.

9. The electronic device of claim 1, wherein a boundary between the first dielectric layer and the second dielectric layer is higher than a top surface of the bump portion of the first stud bump.

10. The electronic device of claim 1, further comprising a semiconductor die electrically connected to the upper circuit layer.

11. The electronic device of claim 1, wherein the lower circuit layer contacts the bump portion of the first stud bump.

12. The electronic device of claim 1, wherein the at least one first stud bump includes a plurality of first stud bumps, and the first dielectric layer defines a recess portion between two adjacent first stud bumps.

13. The electronic device of claim 12, wherein a gap between the two adjacent first stud bumps is greater than 0.2 times a height of the bump portion of the first stud bump.

14. The electronic device of claim 1, wherein a material of the first dielectric layer is same as a material of the second dielectric layer.

15. The electronic device of claim 1, further comprising a bottom circuit layer disposed on a bottom surface of the first dielectric layer far away from the second dielectric layer, wherein the bottom circuit layer contacts the bump portion of the first stud bump.

16. The electronic device of claim 1, wherein a bottom surface of the bump portion of the first stud bump is recessed from a bottom surface of the first dielectric layer.

17. The electronic device of claim 1, further comprising at least one second stud bump, wherein two ends of the second stud bump contact the lower circuit layer and the upper circuit layer respectively.

18. An electronic device, comprising:
a first dielectric layer;
a second dielectric layer disposed on the first dielectric layer; and
at least two first stud bumps disposed in the first dielectric layer and the second dielectric layer, wherein each of the first stud bumps includes a bump portion and a stud portion, the stud portions are disposed on the respective bump portions, each of the bump portions of the two first stud bumps has a height, and the heights of the bump portions of the two first stud bumps are different from each other.

* * * * *